(12) United States Patent
Tomita

(10) Patent No.: US 6,552,400 B2
(45) Date of Patent: Apr. 22, 2003

(54) SEMICONDUCTOR DEVICE AND METHOD OF MANUFACTURING THE SAME

(75) Inventor: Kazuo Tomita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/910,825

(22) Filed: Jul. 24, 2001

(65) Prior Publication Data

US 2002/0093040 A1 Jul. 18, 2002

(30) Foreign Application Priority Data

Jan. 18, 2001 (JP) ........................................ 2001-009881

(51) Int. Cl.⁷ .............................................. H01L 27/092
(52) U.S. Cl. ........................................ 257/371; 257/413
(58) Field of Search ................................ 257/371, 412, 257/413

(56) References Cited

U.S. PATENT DOCUMENTS 5,440,154 A * 8/1995 Carmichael et al. ........ 257/443
5,877,535 A * 3/1999 Matsumoto ................. 257/413
6,043,546 A * 3/2000 Akiyama .................... 257/413

FOREIGN PATENT DOCUMENTS

| JP | 6-89978 | 3/1994 |
| JP | 9-260509 | 10/1997 |
| JP | 10-12745 | 1/1998 |

* cited by examiner

Primary Examiner—Gene M. Munson
(74) Attorney, Agent, or Firm—McDermott, Will & Emery

(57) ABSTRACT

Disclosed herein is a semiconductor device wherein element active regions for an N channel region and a P channel region are formed so as to adjoin each other, and gate electrode is formed so as to stride over both channel regions and an element isolation oxide film for separating both channel regions from each other. In the semiconductor device, the gate electrode comprises a structure wherein a polycrystalline silicon film, a first barrier metal film, a second barrier metal film and a metal film are laminated in order from below. The first barrier metal film is removed at the border part between the N channel region and the P channel region.

3 Claims, 16 Drawing Sheets

206  401

411  206

606    801

811    606

1006    1201

1211    1006

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and is particularly suitable for application to a semiconductor device equipped with MOSFETs for Dual Gate electrodes.

2. Background Art

With advances in scale-down, high integration and speeding up of a device, a reduction in the resistance of the gate electrode in an element has recently been of importance. As a method of reducing the resistance of the gate electrode, there is known a method of forming a low-resistance metal film such as a tungsten (W) film on a polycrystalline silicon film. However, when the metal film is directly stacked or layered on the polycrystalline silicon film, the polycrystalline silicon film and the metal film are brought into silicidation upon subsequent heat treatment, thus causing a problem on the reliability of an oxide film. Therefore, a barrier metal film such as a tungsten nitride (WN) film has been formed at an interface surface between the polycrystalline silicon film and the tungsten film.

FIG. 19 is a schematic cross-sectional view showing the neighborhood of a border part between an N channel region and a P channel region of a MOS transistor having dual gate electrodes. In the drawing, a silicon substrate 100 is separated into elements by an element isolation oxide film 103. Polycrystalline silicon film is formed on a P well 201 in the N channel region and an N well 202 in the P channel region as gate electrode. Thereafter, an N type impurity and a P type impurity are respectively introduced into the polycrystalline silicon film in the N channel region and the polycrystalline silicon film in the P channel region to thereby form polycrystalline silicon film 207, 208 containing dopants.

In order to achieve a reduction in the resistance of the gate electrode, a tungsten film used as a metal film 211 is formed over the polycrystalline silicon film 207, 208. Further, a tungsten nitride film (WN) used as a barrier metal film 1310 is formed at a boundary face between the polycrystalline silicon film 207, 208 and the metal film 211. The formation of the barrier metal film 1310 at the boundary face between the polycrystalline silicon film 207, 208 and the metal film 211 in this way makes it possible to prevent the polycrystalline silicon film and the metal film from being silicidized, whereby the reliability of the oxide film can be enhanced.

However, a problem arises in that while the reliability of the oxide film can be satisfied when the barrier metal film 1310 such as the tungsten nitride (WN) is formed at the boundary face between the polycrystalline silicon film 207, 208 and the metal film 211 as shown in FIG. 19, the boundary face between the polycrystalline silicon film 207, 208 and the metal film 211 is brought to a non-ohmic junction, thereby increasing interface resistance.

FIG. 20 shows the manner in which a barrier metal film is constituted of a structure wherein a tungsten silicide (WSi) film used as a first barrier metal film 1409 is layered or stacked on a tungsten nitride (WN) film used as a second barrier metal film 1410, in order to avoid an increase in the interface resistance. In such a constitution, a problem arises in that while interface resistance is reduced due to an ohmic junction, dopants in polycrystalline silicon films 207 and 208 are interdiffused between an N channel region and a P channel region through the first barrier metal film 1409 by heat treatment corresponding to a subsequent process step, thereby shifting the threshold of a MOS transistor.

SUMMARY OF THE INVENTION

The present invention aims to provide a semiconductor device having a dual gate electrode structure, wherein in a device using polymetal gates, a first barrier metal on polysilicon is etched at the boundary between an N-ch region and a P-ch region, followed by deposition of a second barrier metal, whereby interface resistance and interdiffusion can be restrained.

The present invention has been made to solve the above problems. A first object of the present invention is to prevent a dopant for a polycrystalline silicon film in an N channel region and a dopant for a polycrystalline silicon film in a P channel region from being interdiffused through a first barrier metal film, restrain a change in the threshold of a transistor and reduce interface resistance between a metal film and the polycrystalline silicon film.

A second object of the present invention is to reliably inhibit the diffusion of dopants through a boundary face between a second barrier metal film and a polycrystalline silicon film.

A third object of the present invention is to prevent a resistance value of a gate electrode from being shifted from a reference value due to the formation of a portion with reverse conduction-type dopants mixed therein or a non-doped portion in the polycrystalline silicon film at a border part.

According to one aspect of the present invention, a semiconductor device comprises element active regions for an N channel region and a P channel region. The element active regions are formed so as to adjoin each other; and gate electrode is formed so as to stride over both channel regions and an element isolation oxide film for separating both channel regions from each other. The gate electrode comprises a structure in which a polycrystalline silicon film, a first barrier metal film, a second barrier metal film and a metal film which are laminated in order from below. And the first barrier metal film is removed at a border part between the N channel region and the P channel region.

According to another aspect of the present invention, a method of manufacturing a semiconductor device, an element isolation oxide film is formed on the surface of a semiconductor substrate to define element active regions firstly. Secondly, P type and N type impurities are respectively introduced in the element active regions adjacent to each other, thereby a P well and an N well are respectively formed. A gate oxide film is formed on the surfaces of the P and N wells thirdly. Polycrystalline silicon film is formed over the semiconductor substrate including the P well, the N well and the element isolation oxide film provided thereon fourthly. A first barrier metal film is formed on the polycrystalline silicon film fifthly. The first barrier metal film is removed at a border part between the P well and the N well sixthly. A second barrier metal film is formed on the first barrier metal film and at the border part seventhly. A metal film is formed on the second barrier metal film eighthly.

According to the present invention, the removal of a first barrier metal film at the border part between an N channel region and a P channel region makes it possible to restrain a dopant for a polycrystalline silicon film on the N channel region and a dopant for a polycrystalline silicon film on the P channel region from being interdiffused through the first barrier metal film. Thus, a variation in the threshold of a transistor can be reduced to the minimum. Since the first barrier metal film and a second barrier metal film are formed between a metal film and the polycrystalline silicon film, interface resistance therebetween can be reduced.

Since the upper surface of polycrystalline silicon film is removed by a predetermined amount to dig a trench at the border part between the N channel region and the P channel region, it is possible to reliably restrain the diffusion of dopants through a boundary face between the second barrier metal film and the polycrystalline silicon film. Since the trench is defined, the thickness of the metal film can be increased at the border part. Thus, the effective thickness of the gate electrode can be increased and hence the resistance of the gate electrode per se can be reduced.

The removal of the polycrystalline silicon film together with the first barrier metal film at the border part between the N channel region and the P channel region makes it possible to restrain the diffusion of dopants due to high-temperature heat treatment in a subsequent process step and prevent the occurrence of a portion with reverse conduction-type dopants mixed therein or a non-doped portion in the polycrystalline silicon film at the border part. Thus, the resistance value of the gate electrode can be prevented from being shifted from a reference value.

Since an element isolation oxide film can be removed by a predetermined amount from its upper surface at a portion where the second barrier metal film is brought into intimate contact with the element isolation oxide film, dopants can more reliably prevented from being diffused through the boundary face between the second barrier metal film and the polycrystalline silicon film.

Other and further objects, features and advantages of the invention will appear more fully from the following description.

DETAILED DESCRIPTION OF THE PREFERRED EMBODIMENTS

Several embodiments of the present invention will hereinafter be described based on the accompanying drawings.
First Embodiment FIG. 1 is a plan view showing a MOS transistor provided with dual gate electrodes, which is indicative of a semiconductor device according to a first embodiment of the present invention, and FIG. 2 is a cross-sectional view taken along a dashed line I—I' of FIG. 1, respectively.

Figure 1:
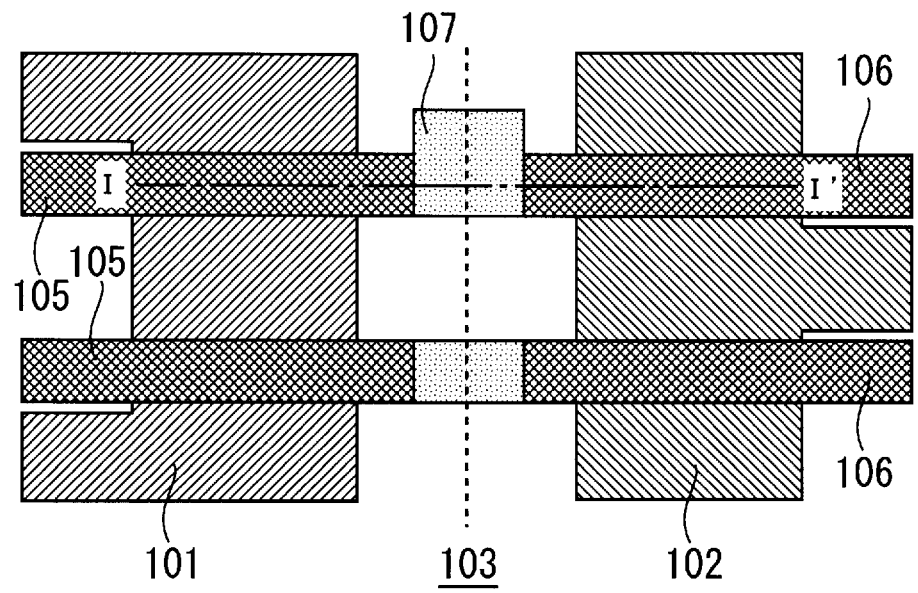
FIG. 1 is a plan view schematically showing a configuration of a semiconductor device according to a first embodiment of the present invention.
Figure 2:
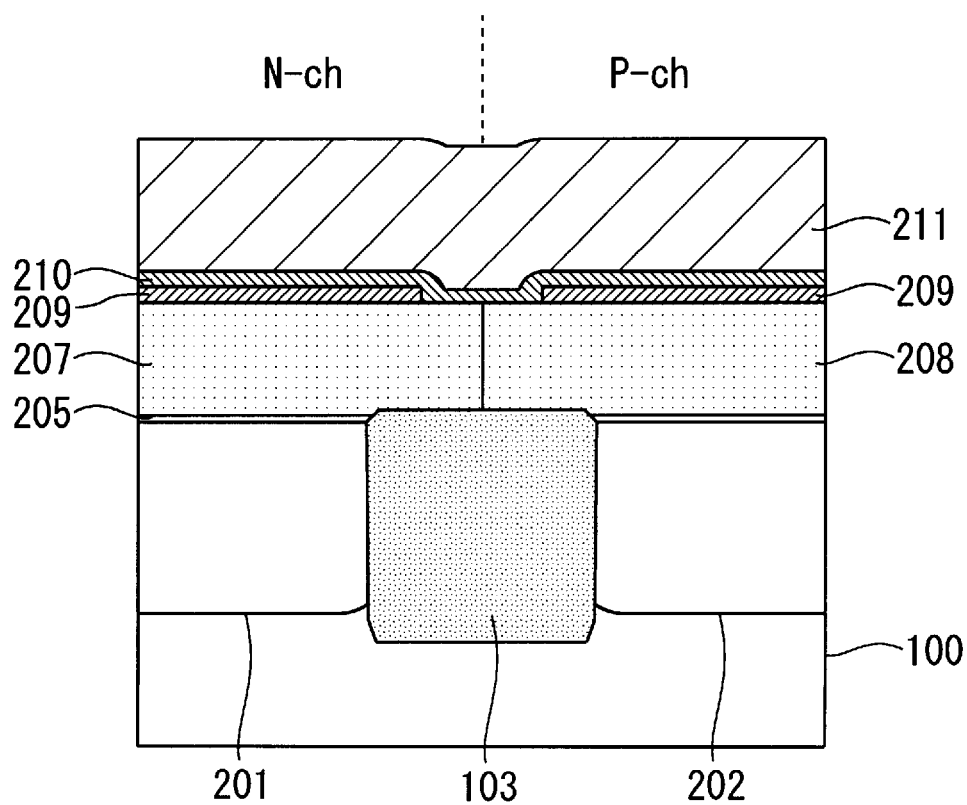
FIG. 2 is a cross-sectional view schematically illustrating the configuration of the semiconductor device according to the first embodiment of the present invention.

In FIG. 1, reference numeral 101 indicates an N channel (N-ch) region corresponding to an element active region, reference numeral 102 indicates a P channel (P-ch) region corresponding to an element active region, and reference numeral 103 indicates an element isolation oxide film for separating the two channel regions from each other, respectively. Further, reference numeral 105 indicates a gate electrode for the N channel region 101 and reference numeral 106 indicates a gate electrode for the P channel region 102. The minimum sizes of both gate electrodes are respectively designed so that their gate widths (L)=0.10 $\mu$m, for example. Reference numeral 107 indicates a gate electrode at a border part between the N channel region 101 and the P channel region 102. A pattern width thereof is set as 0.15 $\mu$m, for example.

A sectional configuration of FIG. 1 will next be explained with reference to FIG. 2. In FIG. 2, reference numeral 201 indicates a P well formed on a silicon substrate 100 within the N channel region 101. The P well 201 is formed by, for example, placing a mask on a P-type silicon substrate 100 having a resistivity of about 10Ω·cm and ion-implanting boron (B) therein. Reference numeral 202 indicates an N well formed on the silicon substrate 100 within the P channel region 102. The N well 202 is formed by, for example, placing a mask on the above-described silicon substrate 100 and ion-implanting phosphorus (P) therein.

The element isolation oxide film 103 for separating the P well 201 and the N well 202 from each other is composed of a silicon oxide film. The element isolation oxide film 103 is formed by etching the silicon substrate 100 by a trench isolation (STI) method, for example and thereafter embedding an insulating film, e.g., a plasma oxide film (HDP: High Density Plasma or the like) therein.

Reference numeral 205 indicates a gate oxide film, which is formed of an oxynitride film ($SiO_xN_y$) having a thickness of about 3 nm, for example. Reference numeral 207 indicates a polycrystalline silicon (polysilicon) film on the N channel region 101, which constitutes the gate electrode 105. The polycrystalline silicon film 207 is formed by, for example, growing a non-doped polycrystalline silicon film 206 with a thickness of about 100 nm, thereafter placing a mask thereon and implanting phosphorus therein. Reference numeral 208 indicates a polycrystalline silicon film on the P channel region 102, which constitutes the gate electrode 106. The polycrystalline silicon film 208 is formed by, for example, growing a non-doped polycrystalline silicon film 206 with a thickness of about 100 nm, thereafter placing a mask thereon and implanting boron therein.

Reference numeral 209 indicates a first barrier metal film formed on the polycrystalline silicon films 207, 208. The first barrier metal film 209 is formed by, for example, depositing tungsten silicide ($WSi_x$) with a thickness of about 10 nm by a sputtering method. As shown in FIG. 2, the first barrier metal film 209 is removed at the border part between the N channel region 101 and the P channel region 102.

Reference numeral 210 indicates a second barrier metal film formed on the first barrier metal film 209. The second barrier metal film 210 is formed by, for example, depositing tungsten nitride (: WN) with a thickness of about 10 nm by the sputtering method. Since the first barrier metal film 209 is removed at the border part between the N channel region 101 and the P channel region 102, the polycrystalline silicon film 207, 208 and the second barrier metal film 210 are in close touch with one another in such a border area. Reference numeral 211 indicates a metal film formed on the second barrier metal film 210, which is formed by, for example, depositing tungsten (W) with a thickness of about 100 nm by the sputtering method.

Further, the polycrystalline silicon film 207, the first barrier metal film 209, the second barrier metal film 210 and the metal film 211 constitute the gate electrode 105 on the N channel region 101, whereas the polycrystalline silicon film 208, the first barrier metal film 209, the second barrier metal film 210 and the metal film 211 constitute the gate electrode 106 on the P channel region 102, respectively.

Thus, in the first embodiment, the first barrier metal film 209 is formed below the second barrier metal film 210, thereby making it possible to obtain interface resistances good in ohmic junction between the metal film 211 and the polycrystalline silicon film 207, 208. Further, the removal of the first barrier metal film 209 at the border part between the N channel region 101 and the P channel region 102 makes it possible to restrain a dopant for the polycrystalline silicon film 207 on the N channel region 101 and a dopant for the polycrystalline silicon film 208 on the P channel region 102 from being interdiffused through the first barrier metal film 209.

A method of manufacturing the semiconductor device according to the present embodiment will next be described based on FIGS. 3 through 6. FIGS. 3A, 3B, 4A and 4B are respectively schematic plan views showing the manufacturing method in process order. FIGS. 5A, 5B, 6A and 6B are respectively schematic cross-sectional views showing the manufacturing method in process order.

Figure 5A:
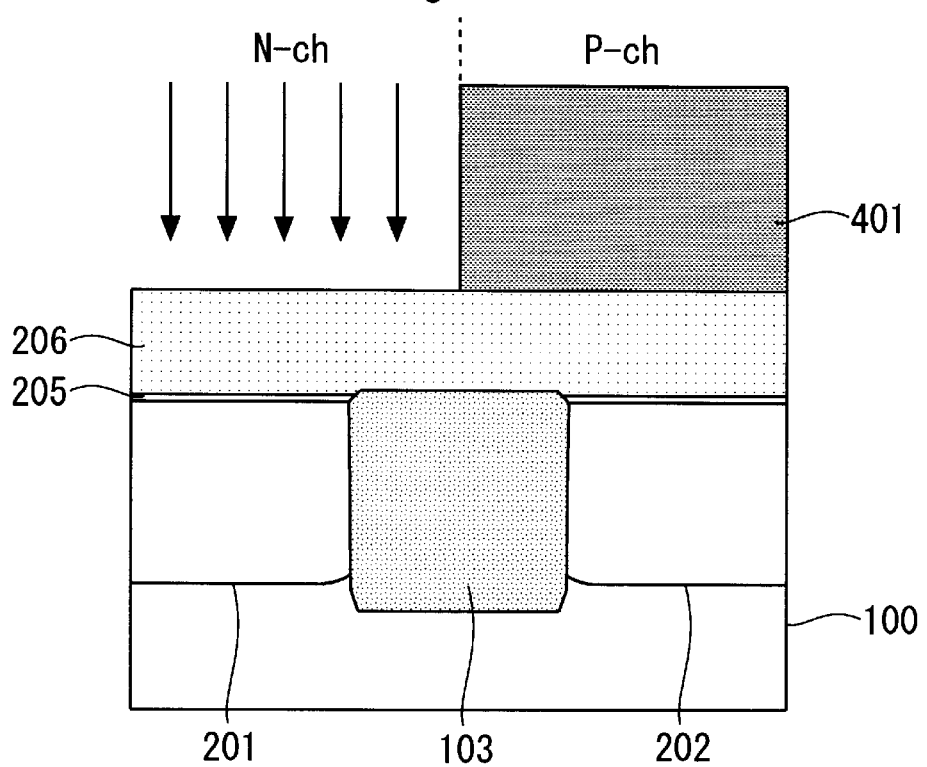
FIGS. 5A and 5B are cross-sectional views schematically illustrating a process for manufacturing the semiconductor device according to the first embodiment of the present invention.

As shown in FIG. 5A, an element isolation region of a P type silicon substrate 100 having a resistivity of about 10Ω·cm is first etched by a trench isolation method, for example, and an insulating film, e.g., a plasma oxide film is embedded in the etched portion to thereby form an element isolation oxide film 103. Next, boron is implanted in the silicon substrate 100 through the use of a mask having opened the N channel region 101 to thereby form a P well 201. Further, phosphorus is implanted in the silicon substrate 100 through the use of a mask having opened the P channel region 102 to thereby form an N well 202.

Figure 3A:
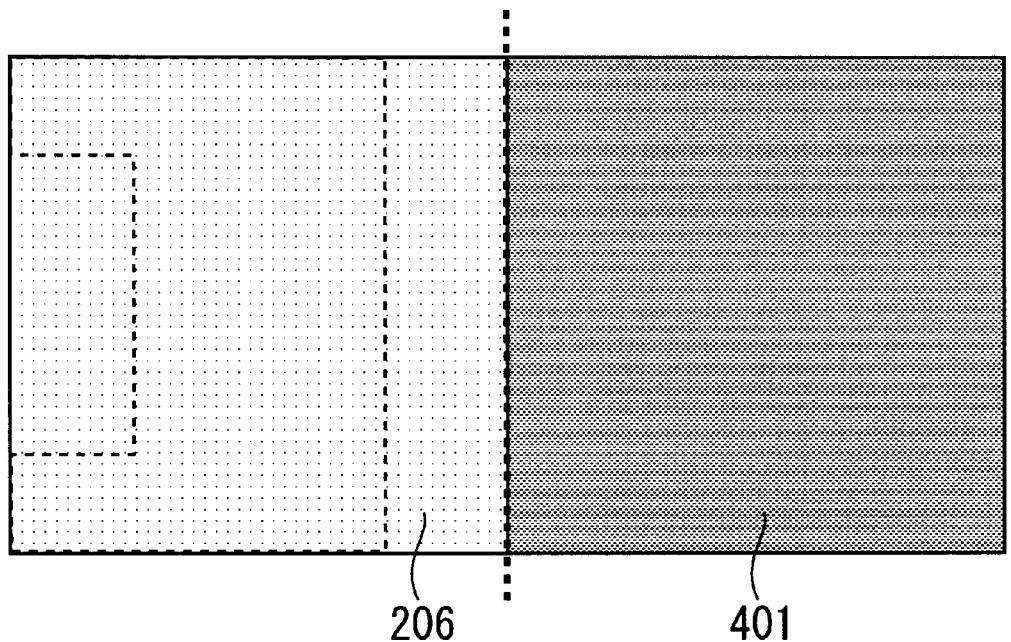
FIGS. 3A and 3B are plan views schematically depicting a process for manufacturing the semiconductor device according to the first embodiment of the present invention.

Subsequently, a gate oxide film 205 is formed over the surfaces of the N channel region 101 and P channel region 102 on the silicon substrate 100 with a thickness of about 3 nm by nitride oxidation, for example. A non-doped polycrystalline silicon film 206 is grown on the gate oxide film 205 and the element isolation oxide film 103 by 100 nm in thickness, for example. Afterwards, phosphorus ($P^+$) is ion-implanted in the polycrystalline silicon film 206 on the N channel region 101 through the use of a resist mask 401 having opened the N channel region 101 under the condition of, for example, acceleration energy of about 10 keV and a dose of about $5 \times 10^{15}$ $cm^{-2}$. FIG. 3A is a plan view showing a state in which the resist mask 401 has been formed so as to open the N channel region 101. Owing to the above ion-implantation, the polycrystalline silicon film 206 for the N channel region 101 results in a polycrystalline silicon film 207 containing an impurity, whereby predetermined conductivity is ensured.

Figure 3B:
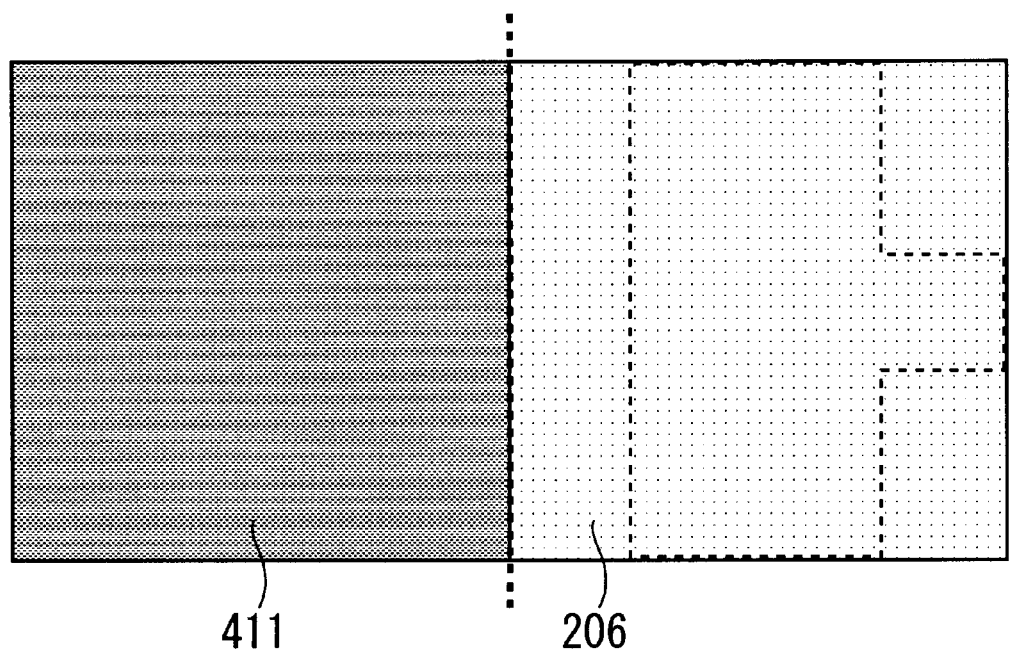
Figure 5B:
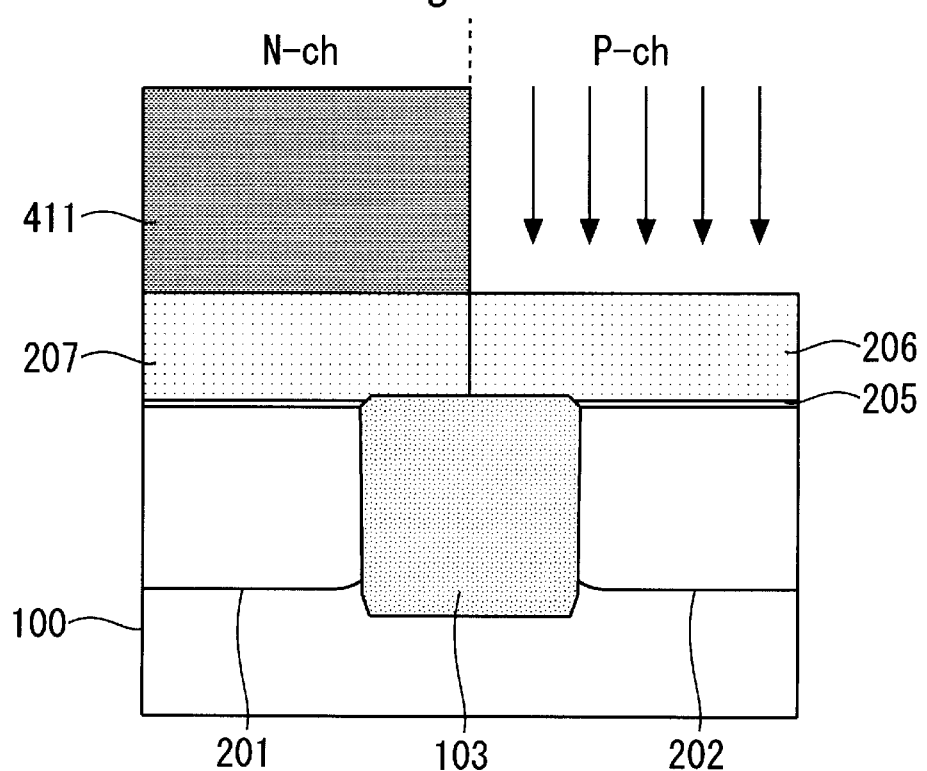

Next, the resist mask 401 is removed by a method such as ashing. Thereafter, as shown in FIG. 5B, boron ($BF_2^+$) is ion-implanted in the polycrystalline silicon film 206 on the P channel region 102 under the condition of, for example, acceleration energy of 5 keV, and a dose of about $5 \times 10^{15}$ $cm^{-2}$ through the use of a resist mask 411 having opened the P channel region 102. FIG. 3B is a plan view showing a state in which the resist mask 411 has been formed so as to open the P channel region 102. Owing to the ion-implantation referred to above, the polycrystalline silicon film 206 on the P channel region 102 results in a polycrystalline silicon film 208 containing an impurity, whereby predetermined conductivity is ensured.

Figure 4A:
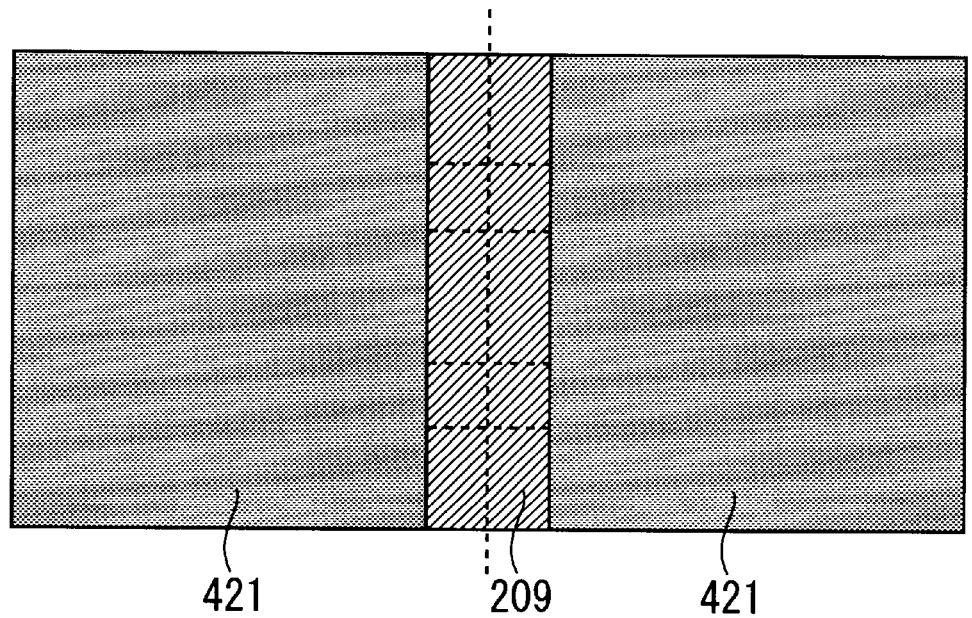
FIGS. 4A and 4B are plan views schematically showing a process for manufacturing the semiconductor device according to the first embodiment of the present invention.
Figure 6A:
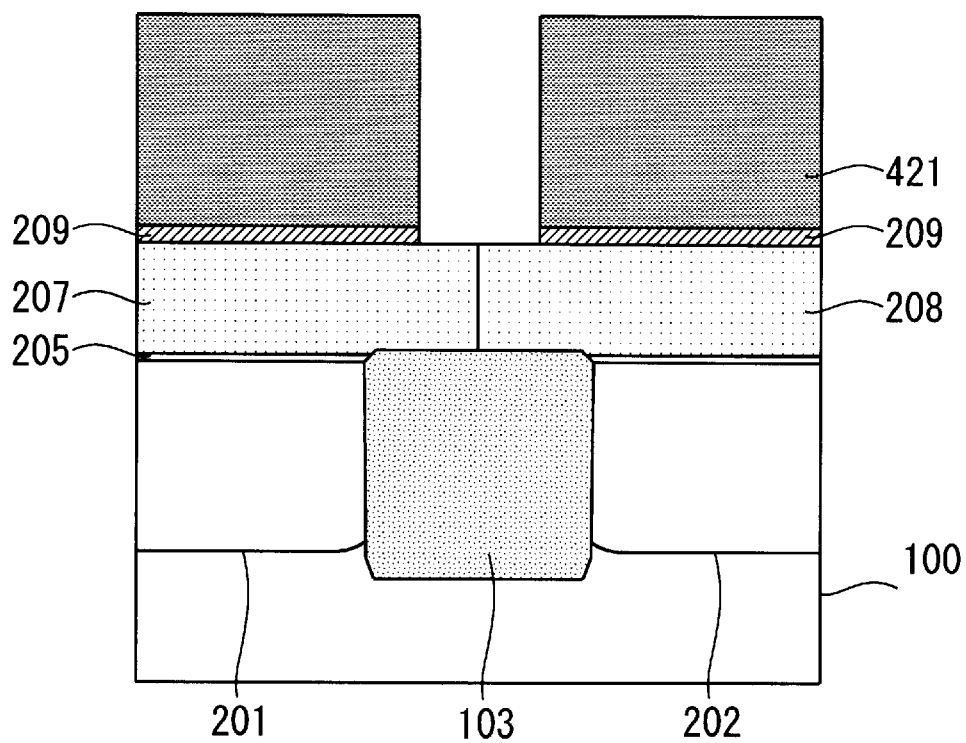
FIGS. 6A and 6B are cross-sectional views schematically depicting a process for manufacturing the semiconductor device according to the first embodiment of the present invention.

Next, for example, tungsten silicide ($WSi_x$) film is deposited on the polycrystalline silicon film 207, 208 with a thickness of about 10nm as a first barrier metal film 209 by a sputtering method as shown in FIG. 6A. Thereafter, a resist mask 421 having an opening whose width is about 0.15 μm, is formed on the first barrier metal film 209 at the border part between the N channel region 101 and the P channel region 102. Further, the first barrier metal film 209 exposed at the opening is removed by dry etching. FIG. 4A is a plan view showing a state in which the resist mask 421 for opening the boundary between the N channel region 101 and the P channel region 102 has been formed.

Figure 6B:
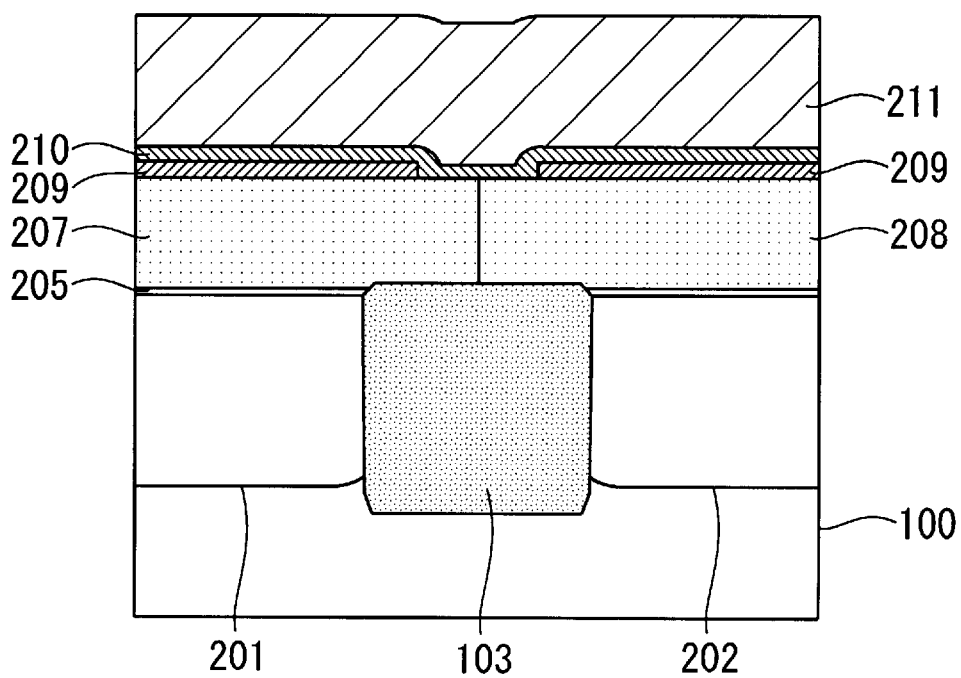

Next, the resist mask 421 is removed by the method such as ashing. As shown in FIG. 6B, for example, a tungsten nitride film is deposited over the first barrier metal film 209 and the polycrystalline silicon film 207, 208 at the border part between the N channel region 101 and the P channel region 102 with a thickness of about 10 nm as a second barrier metal film 210. Afterwards, for example, a tungsten (W) film is deposited on the second barrier metal film 210 by 100 nm in thickness as a metal film 211 by sputtering method.

Figure 4B:
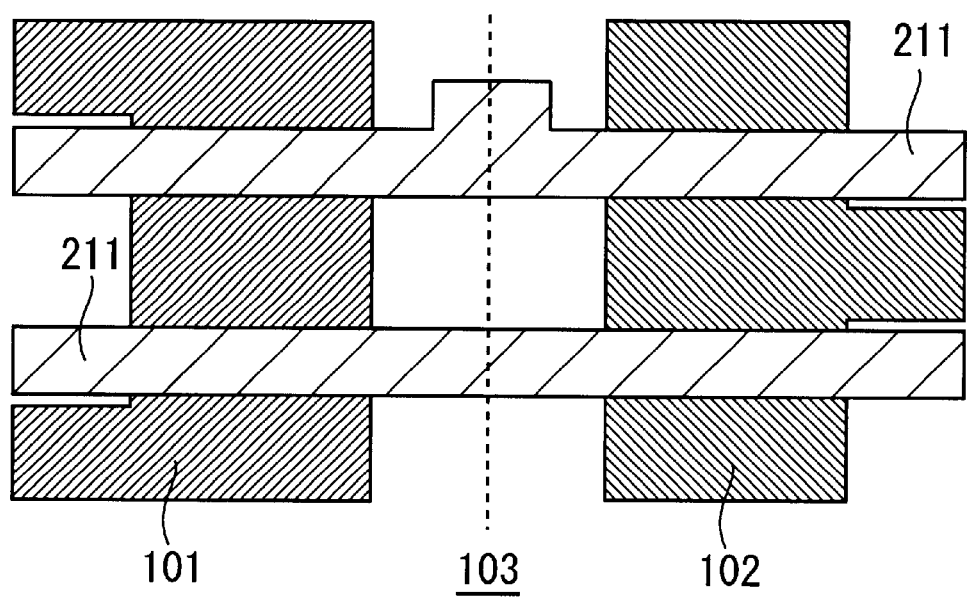

Next, a gate mask (not shown) for forming each gate electrode is formed on the metal film 211 by photolithography and dry etching following it, and the metal film 211, the second barrier metal film 210, the first barrier metal film 209 and the polycrystalline silicon film 207, 208 are dry-etched. Thus, a gate electrode 105 used as a polymetal gate electrode, which comprises the metal film 211, the second barrier metal film 210, the first barrier metal film 209 and the polycrystalline silicon film 207, is formed on its corresponding N channel region 101, whereas a gate electrode 106 used as a polymetal gate electrode, which comprises the metal film 211, the second barrier metal film 210, the first barrier metal film 209 and the polycrystalline silicon film 208, is formed on its corresponding P channel region 102. FIG. 4B shows a state in which the gate electrodes 105 and 106 have been formed. In this condition, the upper surface of the metal film 211 corresponding to the top layer of each of the gate electrodes 105 and 106 is exposed.

Thereafter, a P well 201 and an N well 202 placed on both sides of respective patterns for the gate electrodes 105 and 106 are subjected to ion implantation to thereby form an impurity diffused layer which functions as each of a source and a drain, followed by formation of an interlayer insulating film and a predetermined wiring layer, whereby the semiconductor device having the dual gate electrodes, according to the first embodiment is completed.

Incidentally, the present embodiment has described the case where each of the polymetal gate electrodes (comprising the metal film 211, second barrier metal film 210, first barrier metal film 209 and polycrystalline silicon film 208, 207) is etched with the resist mask. However, the polymetal gate electrode may be etched by using a hard mask, e.g., an oxide film, a nitride film or a laminated film of those films as a mask.

While the present embodiment has described the case in which the first barrier metal film 209 is dry-etched, the first barrier metal film 209 may be wet-etched using, for example, aqueous hydrofluoric acid for its removal. While the present embodiment has also described the case in which the polycrystalline polysilicon film 206 (207, 208) has been grown for the polymetal gate electrode, amorphous silicon may be grown or monocrystal silicon may be grown by an epitaxial method.

Second Embodiment

Figure 7:
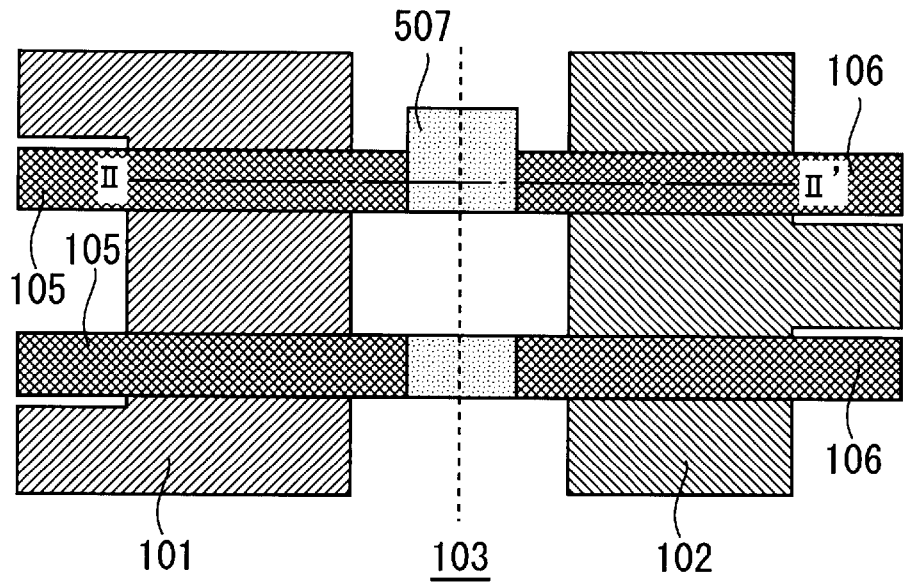
FIG. 7 is a plan view schematically showing a configuration of a semiconductor device according to a second embodiment of the present invention.
Figure 8:
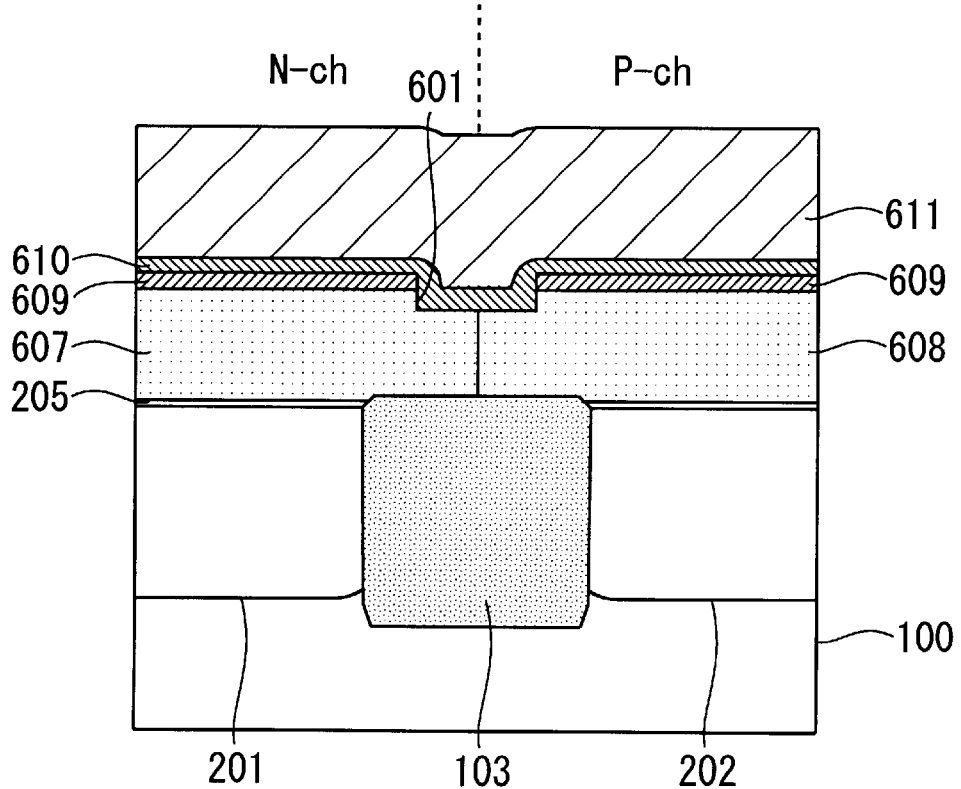
FIG. 8 is a cross-sectional view schematically illustrating the configuration of the semiconductor device according to the second embodiment of the present invention.

FIG. 7 is a plan view showing a MOS transistor equipped with dual gate electrodes, which is indicative of a semiconductor device according to a second embodiment of the present invention, and FIG. 8 is a cross-sectional view taken along a dashed line II—II' of FIG. 7, respectively.

In FIG. 7, reference numeral 101 indicates an N channel (N-ch) region corresponding to an element active region, reference numeral 102 indicates a P channel (P-ch) region corresponding to an element active region, and reference numeral 103 indicates an element isolation oxide film for separating both channel regions from each other, respectively. Further, reference numeral 105 indicates a gate electrode for the N channel region 101 and reference numeral 106 indicates a gate electrode for the P channel region 102. The minimum sizes of both gate electrodes are respectively designed so that their gate widths (L) =0.10 µm, for example. Reference numeral 507 indicates a gate electrode at the border part between the N channel region 101 and the P channel region 102. A pattern width of gate electrode 507 is set as 0.15 µm, for example.

A sectional configuration of FIG. 7 will next be explained with reference to FIG. 8. In FIG. 8, reference numeral 201 indicates a P well formed on a silicon substrate 100 within the N channel region 101. The P well is formed by, for example, placing a mask on a P-type silicon substrate 100 having a resistivity of about 10Ω·cm and ion-implanting boron (B) therein. Reference numeral 202 indicates an N well formed on the silicon substrate 100 within the P channel region 102. The N well 202 is formed by, for example, placing a mask on the above-described silicon substrate 100 and ion-implanting phosphorus (P) therein.

The element isolation oxide film 103 for separating the P well 201 and the N well 202 from each other is composed of a silicon oxide film. The element isolation oxide film 103 is formed by etching the silicon substrate 100 by a trench isolation (STI) method, for example, and thereafter embedding an insulating film, e.g., a plasma oxide film therein.

Reference numeral 205 indicates a gate oxide film, which is formed of an oxynitride film ($SiO_xN_y$) having a thickness of about 3 nm, for example. Reference numeral 607 indicates a polycrystalline silicon (polysilicon) film on the N channel region 101, which constitutes the gate electrode 105. The polycrystalline silicon film 607 is formed by, for example, growing a non-doped polycrystalline silicon film 606 with a thickness of about 100 nm, thereafter placing a mask thereon and implanting phosphorus therein. Reference numeral 608 indicates a polycrystalline silicon film on the P channel region 102, which constitutes the gate electrode 106. The polycrystalline silicon film 608 is formed by, for example, growing a non-doped polycrystalline silicon film 606 with a thickness of about 100 nm, thereafter placing a mask thereon and implanting boron therein.

Reference numeral 609 indicates a first barrier metal film formed on the polycrystalline silicon film 607, 608. The first barrier metal film 609 is formed by, for example, depositing tungsten silicide ($WSi_x$) with a thickness of about 10 nm by a sputtering method. As shown in FIG. 8, the first barrier metal film 609 is removed at the border part between the N channel region 101 and the P channel region 102. The polycrystalline silicon film 607, 608 are also respectively removed predetermined amounts at the border part between the N channel region 101 and the P channel region 102, then a trench 601 is defined in a portion where they are removed.

Reference numeral 610 indicates a second barrier metal film formed on the first barrier metal film 609. The second barrier metal film 610 is formed by, for example, depositing tungsten nitride (: WN) with a thickness of about 10 nm by the sputtering method. Since the first barrier metal film 609 is removed at the border part between the N channel region 101 and the P channel region 102, the polycrystalline silicon film 607, 608 and the second barrier metal film 610 are in close touch with one another in such a border area. Reference numeral 611 indicates a metal film formed on the second barrier metal film 610, which is formed by, for example, depositing tungsten (W) with a thickness of about 100 nm by the sputtering method.

Further, the polycrystalline silicon film 607, the first barrier metal film 609, the second barrier metal film 610 and the metal film 611 constitute the gate electrode 105 on the N channel region 101, whereas the polycrystalline silicon film 608, the first barrier metal film 609, the second barrier metal film 610 and the metal film 611 constitute the gate electrode 106 on the P channel region 102, respectively.

Thus, in the second embodiment, the first barrier metal film 609 is formed below the second barrier metal film 610 to thereby make it possible to obtain interface resistance good in ohmic junction between the metal film 611 and the polycrystalline silicon film 607, 608. Further, the removal of the first barrier metal film 609 at the border part between the N channel region 101 and the P channel region 102 makes it possible to restrain a dopant for the polycrystalline silicon film 607 on the N channel region 101 and a dopant for the polycrystalline silicon film 608 on the P channel region 102 from being interdiffused through the first barrier metal film 609.

Since the trench 601 is dug in the polycrystalline silicon film 607, 608 at the border part between the N channel region 101 and the P channel region 102, the dopants can reliably be prevented from being diffused through the boundary faces between the second barrier metal film 610 and the polycrystalline silicon film 607, 608. Owing to the formation of the trench 601, the thickness of the metal film 611 can be increased at the border part, thus leading to an increase in the effective thickness of gate electrode, whereby the gate electrodes per se can be reduced in resistance.

A method of manufacturing the semiconductor device according to the present embodiment will next be described using FIGS. 9 through 12. FIGS. 9A, 9B, 10A and 10B are respectively schematic plan views showing the manufacturing method in process order. FIGS. 11A, 11B, 12A and 12B are respectively schematic cross-sectional views showing the manufacturing method in process order.

Figure 11A:
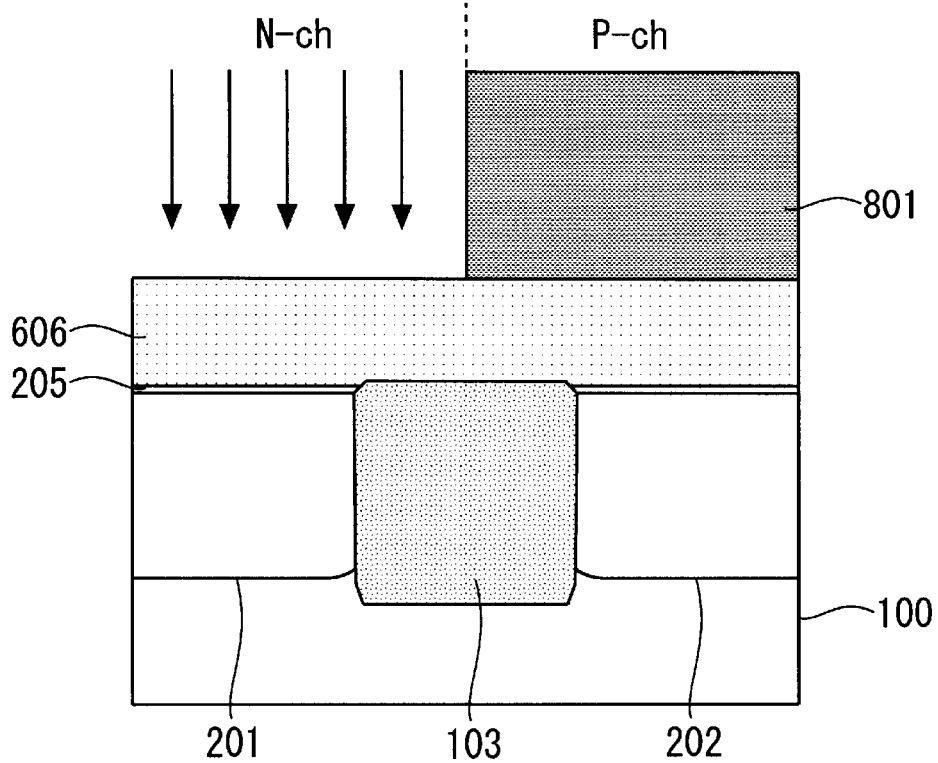
FIGS. 11A and 11B are cross-sectional views schematically illustrating a process for manufacturing the semiconductor device according to the second embodiment of the present invention.

As shown in FIG. 11A, an element isolation region of a P type silicon substrate 100 having a resistivity of about 10Ω·cm is first etched by a trench isolation method, for example, and an insulating film, e.g., a plasma oxide film is embedded in the etched portion to thereby form an element isolation oxide film 103. Next, boron is implanted in the silicon substrate 100 through the use of a mask having opened the N channel region 101 to thereby form a P well 201. Further, phosphorus is implanted in the silicon substrate 100 by using a mask having opened the P channel region 102 to thereby form an N well 202.

Figure 9A:
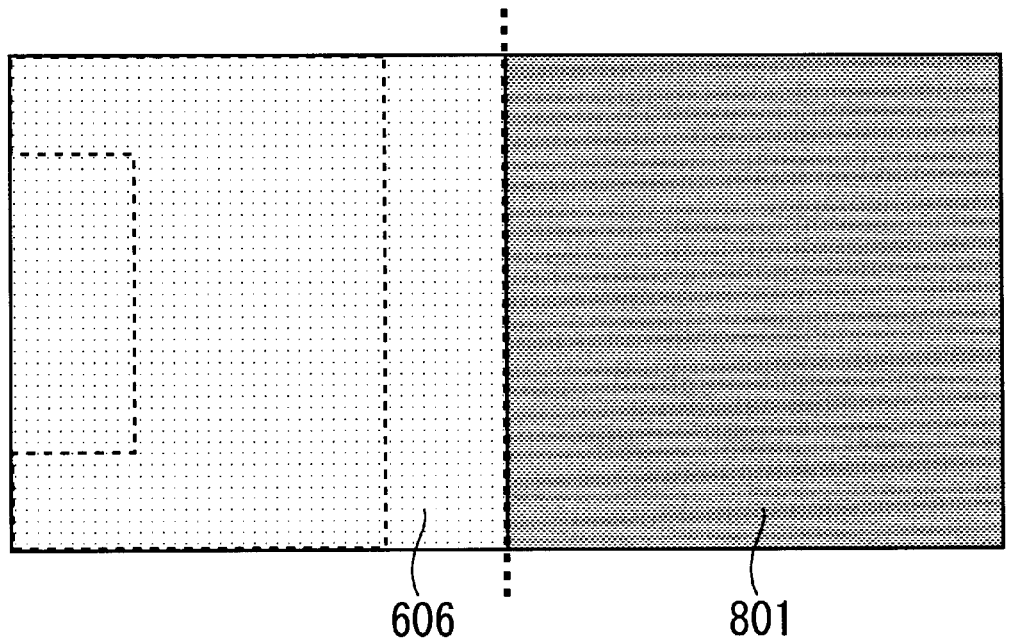
FIGS. 9A and 9B are plan views schematically depicting a process for manufacturing the semiconductor device according to the second embodiment of the present invention.

Subsequently, a gate oxide film 205 is formed over the surfaces of the N channel region 101 and P channel region 102 on the silicon substrate 100 with a thickness of about 3 nm by nitride oxidation, for example. A non-doped polycrystalline silicon film 606 is grown on the gate oxide film 205 and the element isolation oxide film 203 by 100 nm in thickness, for example. Afterwards, phosphorus ($P^+$) is ion-implanted in the polycrystalline silicon film 606 on the N channel region 101 through the use of a resist mask 801 having opened the N channel region 101 under the condition of, for example, acceleration energy of about 10 keV and a dose of about $5\times10^{15}$ $cm^{-2}$. FIG. 9A is a plan view showing a state in which the resist mask 801 has been formed so as to open the N channel region 101. Owing to the above ion-implantation, the polycrystalline silicon film 606 for the N channel region 101 results in a polycrystalline silicon film 607 containing an impurity, whereby predetermined conductivity is ensured.

Figure 9B:
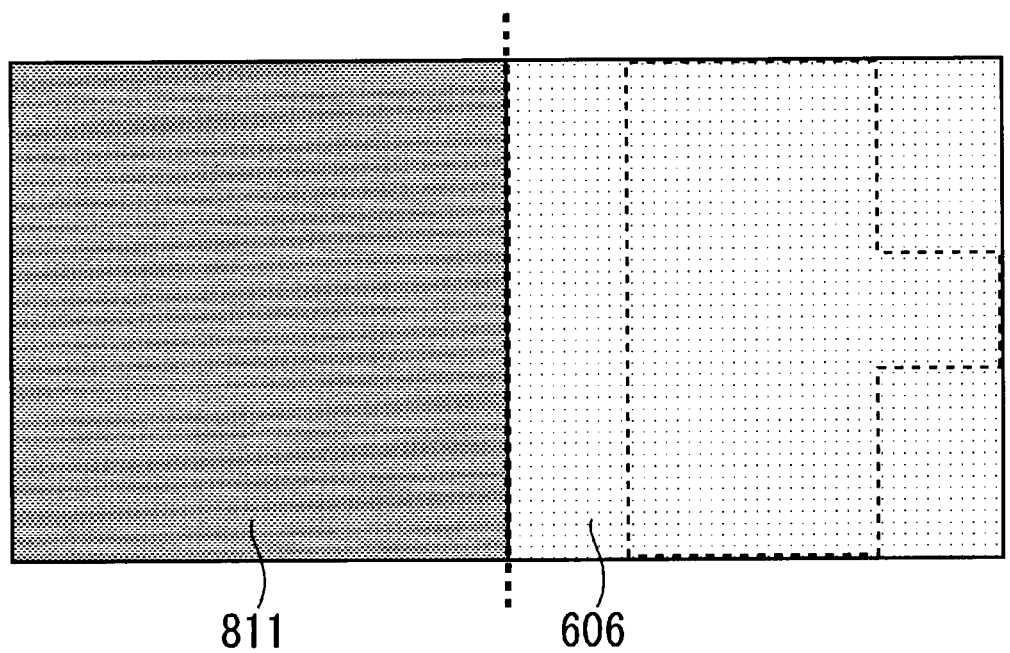
Figure 11B:
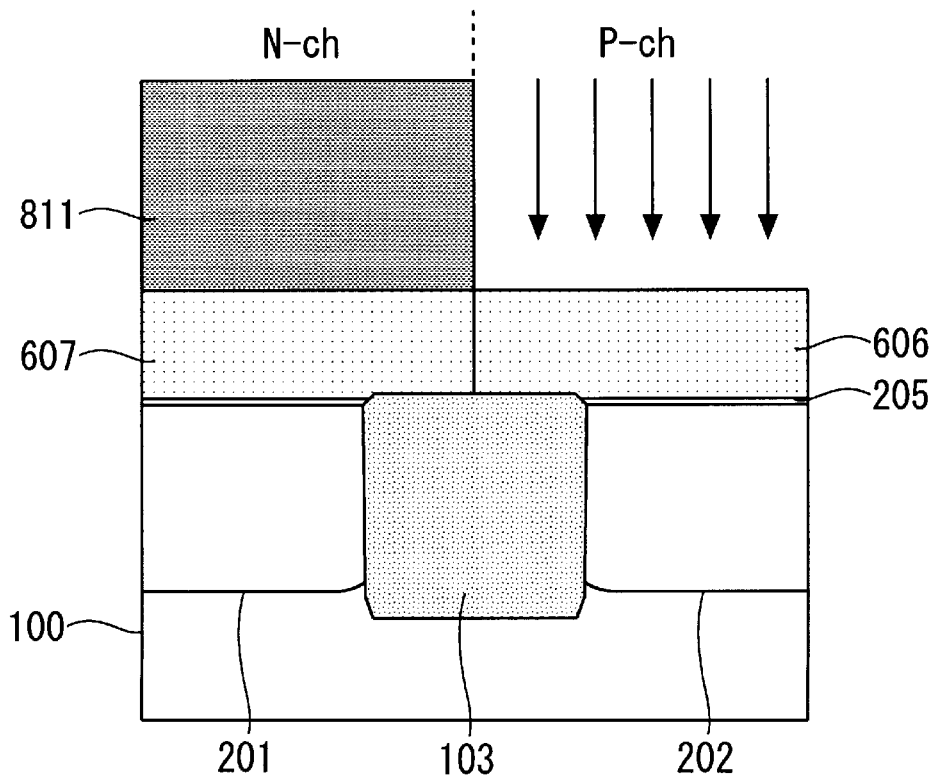

Next, the resist mask 801 is removed by a method such as ashing. Thereafter, as shown in FIG. 11B, boron ($BF_2^+$) is ion-implanted in the polycrystalline silicon film 606 on the P channel region 102 under the condition of, for example, acceleration energy of 5 keV, and a dose of about $5\times10^5$ $cm^{-2}$ through the use of a resist mask 811 having opened the P channel region 102. FIG. 9B is a plan view showing a state in which the resist mask 811 has been formed so as to open the P channel region 102. Owing to the ion-implantation referred to above, the polycrystalline silicon film 606 on the P channel region 102 results in a polycrystalline silicon film 608 containing an impurity, whereby predetermined conductivity is ensured.

Figure 10A:
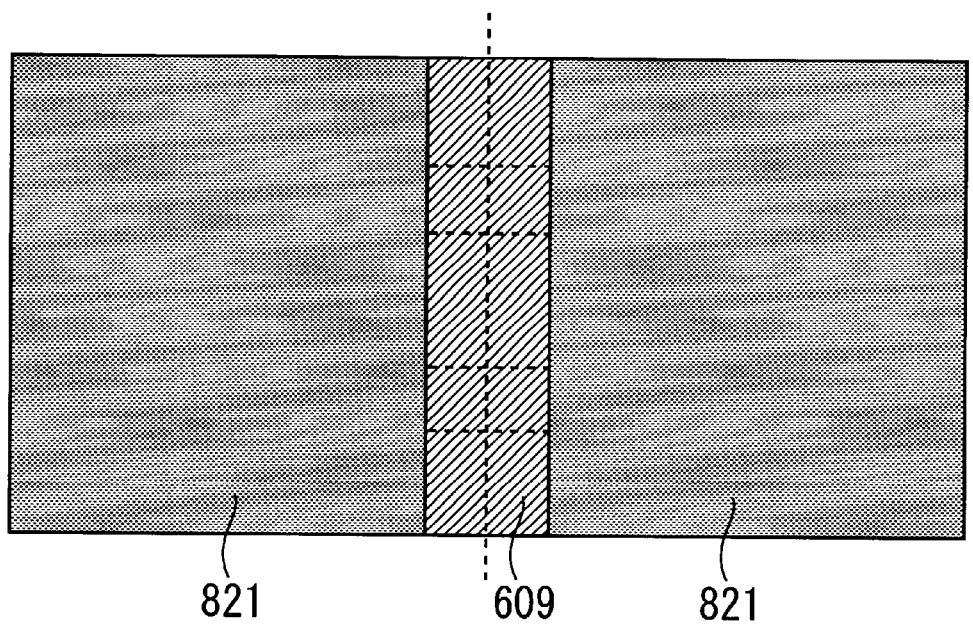
FIGS. 10A and 10B are plan views schematically showing a process for manufacturing the semiconductor device according to the second embodiment of the present invention.
Figure 12A:
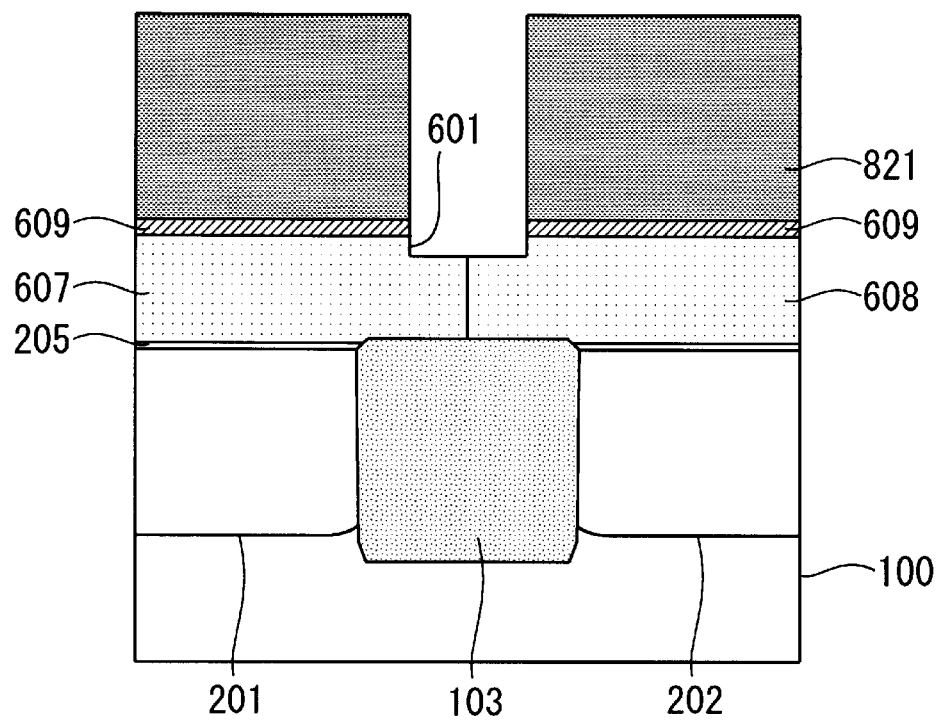
FIGS. 12A and 12B are cross-sectional views schematically depicting a process for manufacturing the semiconductor device according to the second embodiment of the present invention.

Next, for example, tungsten silicide ($WSi_x$) film is deposited on the polycrystalline silicon film 607, 608 with a thickness of about 10 nm as a first barrier metal film 609 by a sputtering method as shown in FIG. 12A. Thereafter, a resist mask 821 having an opening whose width is about 0.15 μm, is formed on the first barrier metal film 609 at the border part between the N channel region 101 and the P channel region 102. Further, the first barrier metal film 609 exposed at the opening is removed by dry etching. After the first barrier metal film 609 has perfectly been removed, parts of the polycrystalline silicon film 607, 608 are further removed by dry etching to thereby define a trench 601. FIG. 10A is a plan view showing a state in which the resist mask 821 for opening the boundary between the N channel region 101 and the P channel region 102 has been formed.

Figure 12B:
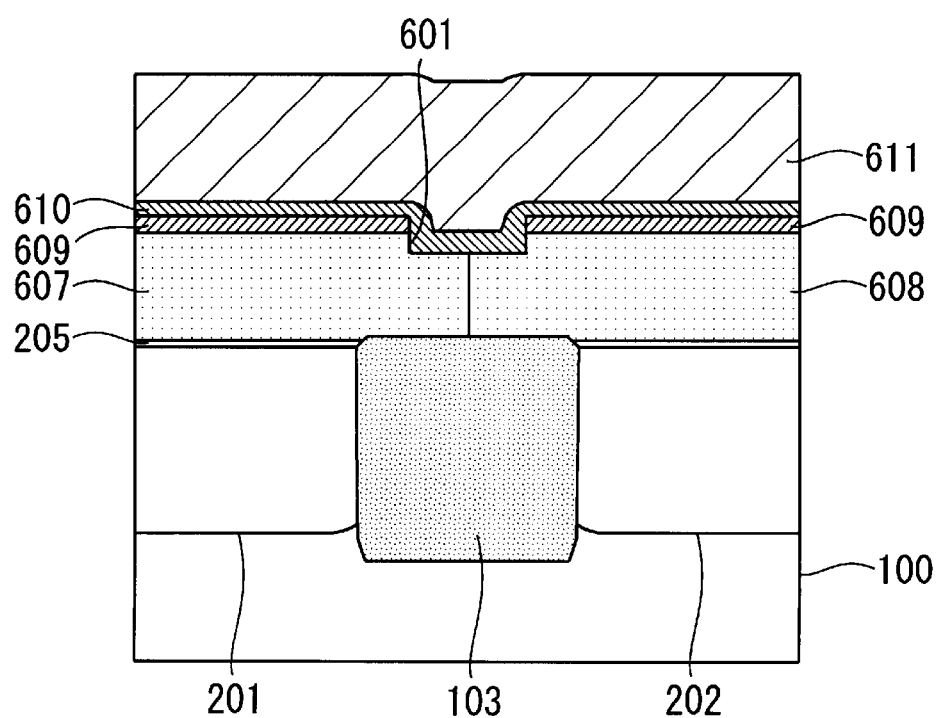

Next, the resist mask 821 is removed by the method such as ashing. As shown in FIG. 12B, for example, a tungsten nitride film is deposited over the first barrier metal 609 and the polycrystalline silicon film 607, 608 provided in the trench 601 with a thickness of about 10 nm as a second barrier metal film 610. Afterwards, for example, a tungsten (W) film is deposited on the second barrier metal film 610 by 100 nm in thickness as a metal film 611 by the sputtering method.

Figure 10B:
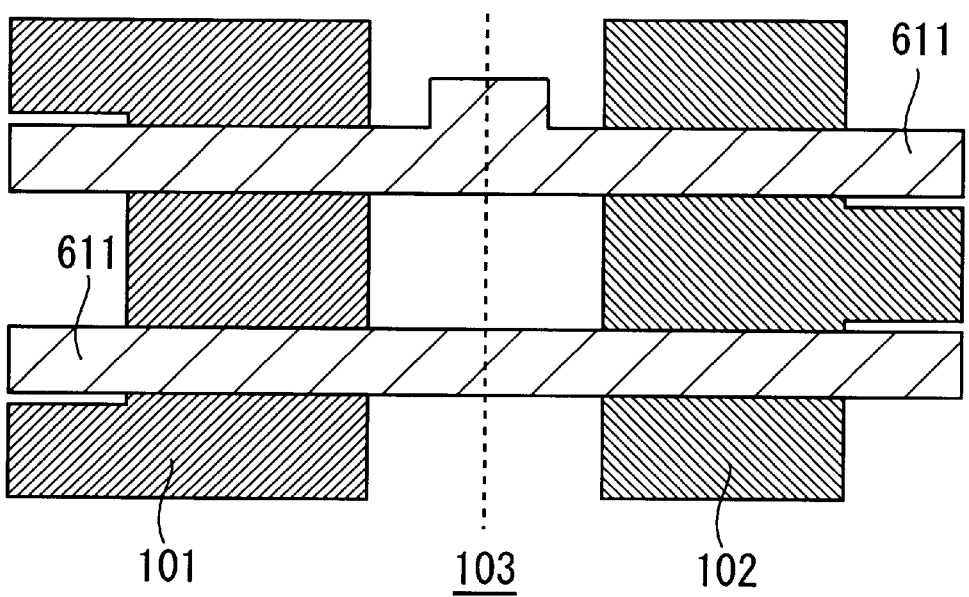

Next, a gate mask (not shown) for forming gate electrode is formed on the metal film 611 by photolithography and dry etching following it. The metal film 611, the second barrier metal film 610, the first barrier metal film 609 and the polycrystalline silicon film 607, 608 are dry-etched. Thus, a gate electrode 105 used as a polymetal gate electrode, which comprises the metal film 611, the second barrier metal film 610, the first barrier metal film 609 and the polycrystalline silicon film 607, is formed on its corresponding N channel region 101, whereas a gate electrode 106 used as a polymetal gate electrode, which comprises the metal film 611, the second barrier metal film 610, the first barrier metal film 609 and the polycrystalline silicon film 608, is formed on its corresponding P channel region 102. FIG. 10B shows a state in which the gate electrodes 105 and 106 have been formed. In this condition, the upper surface of the metal film 611 formed as the top layer of each of the gate electrodes 105 and 106 is exposed.

Thereafter, a P well 201 and an N well 202 placed on both sides of respective patterns for the gate electrodes 105 and 106 are subjected to ion implantation to thereby form an impurity diffused layer which functions as each of a source and a drain, followed by formation of an interlayer insulating film and a predetermined wiring layer, whereby the semiconductor device having the dual gate electrodes, according to the second embodiment is completed.

Incidentally, the present embodiment has also described the case where each of the polymetal gate electrodes (comprising the metal film 611, the barrier metal film 610, the barrier metal film 609 and the polycrystalline silicon film 608, 607) is etched by the resist mask. However, the polymetal gate electrode may be etched by using a hard mask, e.g., an oxide film, a nitride film or a laminated film of an oxide film and a nitride film as a mask.

Further, while the present embodiment has described the case in which the first barrier metal film 609 and the polycrystalline silicon film 607, 608 are dry-etched, the first barrier metal film 609 is wet-etched using, for example, aqueous hydrofluoric acid and further the polycrystalline silicon film 607, 608 may be dry-etched. While the present embodiment has also described the case in which the polycrystalline polysilicon film 606 (607, 608) is grown for the polymetal gate electrode, amorphous silicon may be grown or monocrystal silicon may be grown by an epitaxial method.

Third Embodiment

Figure 13:
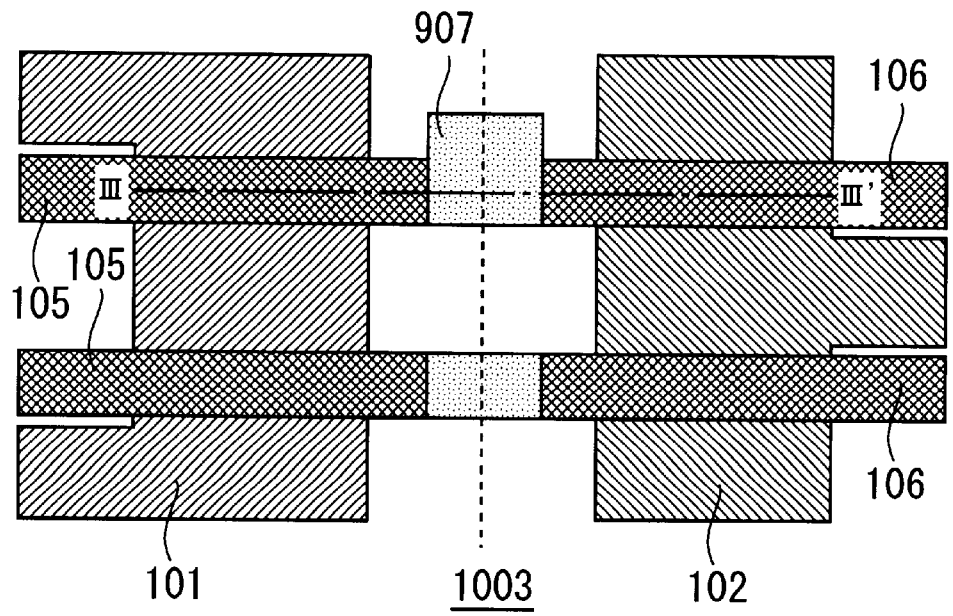
FIG. 13 is a plan view schematically showing a configuration of a semiconductor device according to a third embodiment of the present invention.
Figure 14:
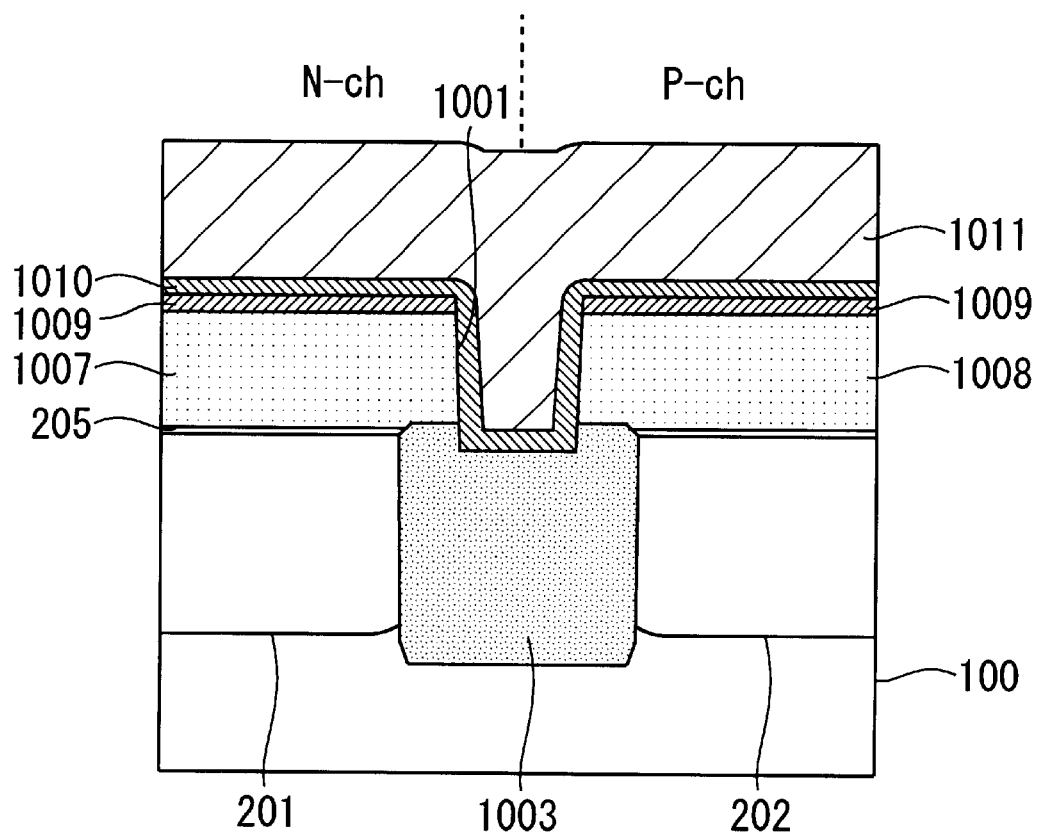
FIG. 14 is a cross-sectional view schematically illustrating the configuration of the semiconductor device according to the third embodiment of the present invention.

FIG. 13 is a plan view showing a MOS transistor equipped with dual gate electrodes, which is indicative of a semiconductor device according to a third embodiment of the present invention, and FIG. 14 is a cross-sectional view taken along a dashed line III—III' of FIG. 13, respectively.

In FIG. 13, reference numeral 101 indicates an N channel (N-ch) region corresponding to an element active region, reference numeral 102 indicates a P channel (P-ch) region corresponding to an element active region, and reference numeral 1003 indicates an element isolation oxide film for separating both channel regions from each other, respectively. Further, reference numeral 105 indicates a gate electrode for the N channel region 101 and reference numeral 106 indicates a gate electrode for the P channel region 102. The minimum sizes of both gate electrodes are respectively designed so that their gate widths (L)=0.10 $\mu$m, for example. Reference numeral 907 indicates a gate electrode at the border part between the N channel region 101 and the P channel region 102. A pattern width thereof is set as 0.15 $\mu$m, for example.

A sectional configuration of FIG. 13 will next be explained with reference to FIG. 14. In FIG. 14, reference numeral 201 indicates a P well formed on a silicon substrate 100 within the N channel region 101. The P well is formed by, for example, placing a mask on a P-type silicon substrate 100 having a resistivity of about 10$\Omega$·cm and ion-implanting boron (B) therein. Reference numeral 202 indicates an N well formed on the silicon substrate 100 within the P channel region 102. The N well is formed by, for example, placing a mask on the above-described silicon substrate 100 and ion-implanting phosphorus (P) therein.

The element isolation oxide film 1003 for separating the P well 201 and the N well 202 from each other is composed of a silicon oxide film. The element isolation oxide film 1003 is formed by etching the silicon substrate 100 by a trench isolation (STI) method, for example and thereafter embedding an insulating film, e.g., a plasma oxide film up to a depth of about 300 nm as viewed from the surface of the silicon substrate 100.

Reference numeral 205 indicates a gate oxide film, which is formed of an oxynitride film (SiO$_x$N$_y$) having a thickness of about 3 nm, for example. Reference numeral 207 indicates a polycrystalline silicon (polysilicon) film on an N channel region 1007, which constitutes the gate electrode 105. The polycrystalline silicon film 207 is formed by, for example, growing a non-doped polycrystalline silicon film 1006 with a thickness of about 100 nm, thereafter placing a mask thereon and implanting phosphorus therein. Reference numeral 1008 indicates a polycrystalline silicon film on the P channel region 102, which constitutes the gate electrode 106. The polycrystalline silicon film 1008 is formed by, for example, growing a non-doped polycrystalline silicon film 1006 with a thickness of about 100 nm, thereafter placing a mask thereon and implanting boron therein.

Reference numeral 1009 indicates a first barrier metal film formed on the polycrystalline silicon film 1007, 1008. The first barrier metal film 1009 is formed by, for example, depositing tungsten silicide (WSi$_x$) with a thickness of about 10 nm by a sputtering method. As shown in FIG. 14, the first barrier metal film 1009 is removed at the border part between the N channel region 101 and the P channel region 102. The polycrystalline silicon film 1007, 1008 are also respectively removed at the border part between the N channel region 101 and the P channel region 102. Further, the element isolation oxide film 1003 placed therebelow is removed by a predetermined amount. A trench 1001 is defined in the so-removed portion.

Reference numeral 1010 indicates a second barrier metal film formed on the first barrier metal film 1009. The second barrier metal film 1010 is formed by, for example, depositing tungsten nitride (: WN) with a thickness of about 10 nm by the sputtering method. Since the first barrier metal film 1009 is removed at the border part between the N channel region 101 and the P channel region 102, and the lower polycrystalline silicon film 1007, 1008 are also removed, the second barrier metal film 1010 is in close touch with the element isolation oxide film 1003 in such a boundary area. Reference numeral 1011 indicates a metal film formed on the second barrier metal film 1010, which is formed by, for example, depositing tungsten (W) with a thickness of about 100 nm by the sputtering method.

Further, the polycrystalline silicon film 1007, the first barrier metal film 1009, the second barrier metal film 1010 and the metal film 1011 constitute the gate electrode 105 on the N channel region 101, whereas the polycrystalline silicon film 1008, the first barrier metal film 1009, the second barrier metal film 1010 and the metal film 1011 constitute the gate electrode 106 on the P channel region 102, respectively.

Thus, in the third embodiment, the first barrier metal film 1009 is formed below the second barrier metal film 1010 to thereby make it possible to obtain interface resistance good in ohmic junction between the metal film 1011 and the polycrystalline silicon film 1007, 1008. Further, the removal of the first barrier metal film 1009 at the border part between the N channel region 101 and the P channel region 102 makes it possible to restrain a dopant for the polycrystalline silicon film 1007 on the N channel region 101 and a dopant for the polycrystalline silicon film 1008 on the P channel region 102 from being interdiffused through the first barrier metal film 1009.

Since the trench 1001 is dug in the polycrystalline silicon film 1007, 1008 at the border part between the N channel region 101 and the P channel region 102, the dopants can reliably be prevented from being diffused through the boundary faces between the second barrier metal film 1010 and the polycrystalline silicon film 1007, 1008. Further, since the polycrystalline silicon film 1007 and the polycrystalline silicon film 1008 are separated at the border part, the diffusion of the dopants can be inhibited owing to high-temperature heat treatment in a subsequent process step. Since the border part is removed even when a region in which dopants of phosphorus and boron are mixed together, is formed in the polycrystalline silicon film 1006 at the border part and a non-doped portion is formed due to a superimposition displacement of a resist mask 1201 and a resist mask 1211 upon ion-implantation, the resistance values of the gate electrodes 105 and 106 can be prevented from being shifted from a reference value. Further, owing to the formation of the trench 1001, the thickness of the metal film 1011 can be increased at the border part, thus leading to an increase in the effective thickness of each gate electrode, whereby the gate electrodes per se can be reduced in resistance.

A method of manufacturing the semiconductor device according to the present embodiment will next be described based on FIGS. 15 through 18. FIGS. 15A, 15B, 16A and 16B are respectively schematic plan views showing the manufacturing method in process order. FIGS. 17A, 17B, 18A and 18B are respectively schematic cross-sectional views showing the manufacturing method in process order.

Figure 17A:
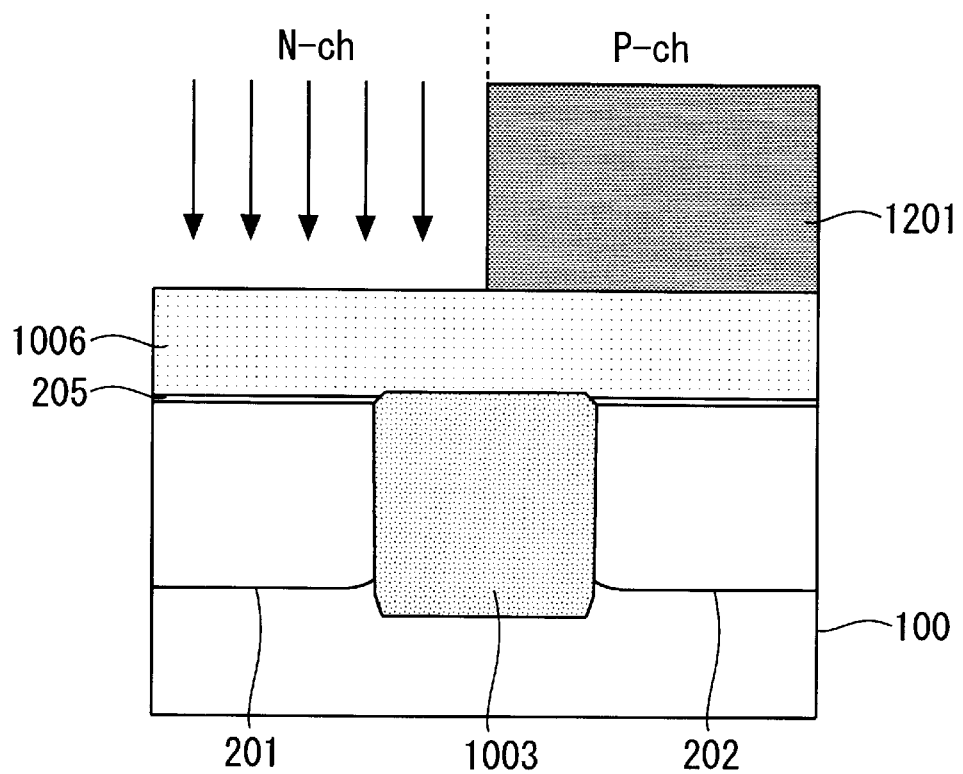
FIGS. 17A and 17B are cross-sectional views schematically illustrating a process for manufacturing the semiconductor device according to the third embodiment of the present invention.

As shown in FIG. 17A, an element isolation region of a P type silicon substrate 100 having a resistivity of about 10$\Omega$·cm is first etched by a trench isolation method, for example. Further, an insulating film, e.g., a plasma oxide film is embedded in the etched portion to thereby form an element isolation oxide film 1003. Next, boron is implanted in the silicon substrate 100 through the use of a mask having opened the N channel region 101 to thereby form a P well 201. Further, phosphorus is implanted in the silicon substrate 100 through the use of a mask having opened the P channel region 102 to thereby form an N well 202.

Figure 15A:
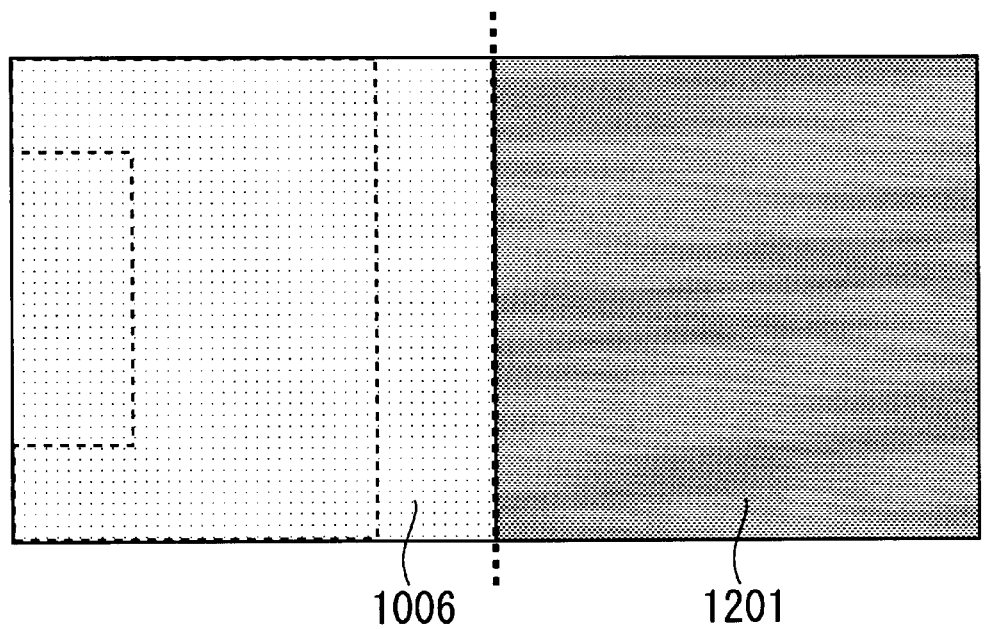
FIGS. 15A and 15B are plan views schematically depicting a process for manufacturing the semiconductor device according to the third embodiment of the present invention.

Subsequently, a gate oxide film 205 is formed over the surfaces of the N channel region 101 and P channel region 102 on the silicon substrate 100 with a thickness of about 3 nm by nitride oxidation, for example. A non-doped polycrystalline silicon film 1006 is grown on the gate oxide film 205 and the element isolation oxide film 1003 by 100 nm in thickness, for example. Afterwards, phosphorus ($P^+$) is ion-implanted in the polycrystalline silicon film 1006 on the N channel region 101 through the use of the resist mask 1201 having opened the N channel region 101 under the condition of, for example, acceleration energy of about 10 keV and a dose of about $5\times10^{15}$ cm$^{-2}$. FIG. 15A is a plan view showing a state in which the resist mask 1201 has been formed so as to open the N channel region 101. Owing to the above ion-implantation, the polycrystalline silicon film 1006 for the N channel region 101 results in a polycrystalline silicon film 1007 containing an impurity, whereby predetermined conductivity is ensured.

Figure 15B:
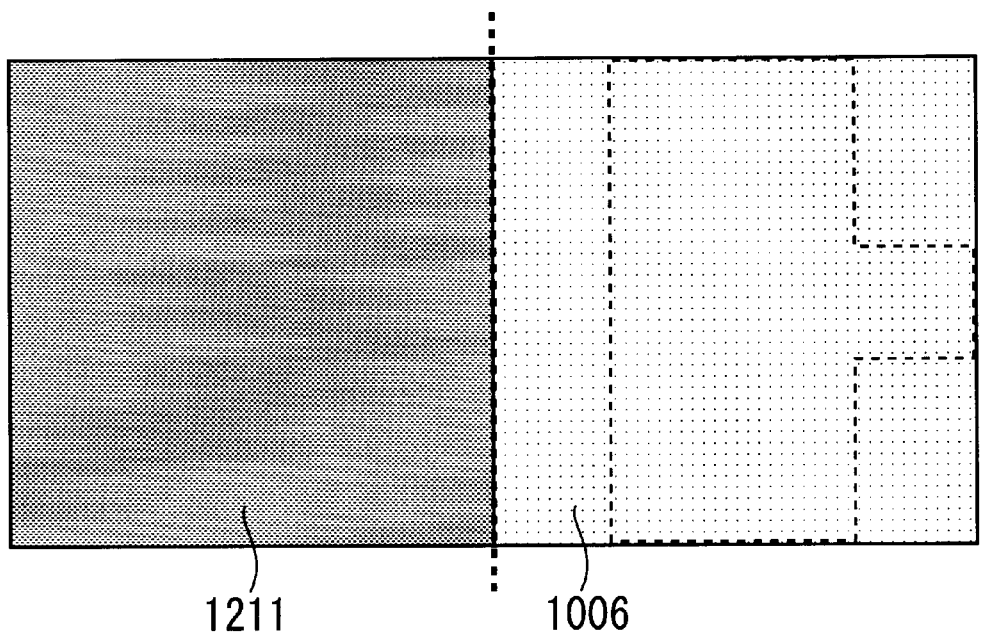
Figure 17B:
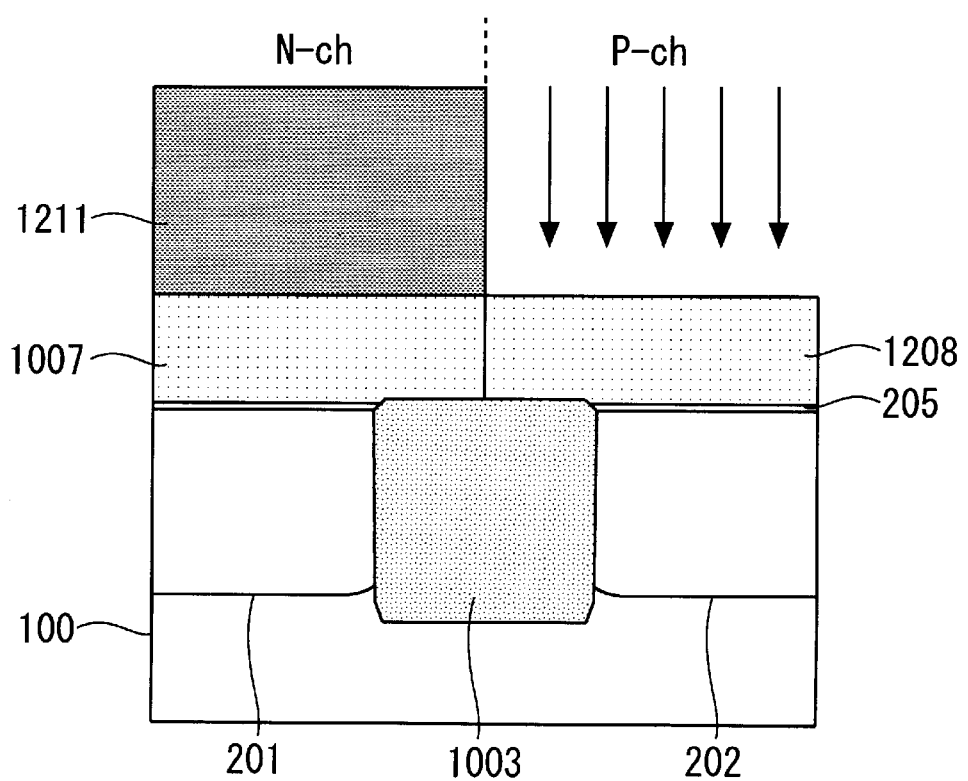

Next, the resist mask 1201 is removed by a method such as ashing. Thereafter, as shown in FIG. 17B, boron ($BF_2^+$) is ion-implanted in the polycrystalline silicon film 1006 on the P channel region 102 under the condition of, for example, acceleration energy of 5 keV, and a dose of about $5\times10^{15}$ cm$^{-2}$ through the use of the resist mask 1211 having opened the P channel region 102. FIG. 15B is a plan view showing a state in which the resist mask 1211 has been formed so as to open the P channel region 102. Owing to the ion-implantation referred to above, the polycrystalline silicon film 1006 on the P channel region 102 results in a polycrystalline silicon film 1008 containing an impurity, whereby predetermined conductivity is ensured.

Figure 16A:
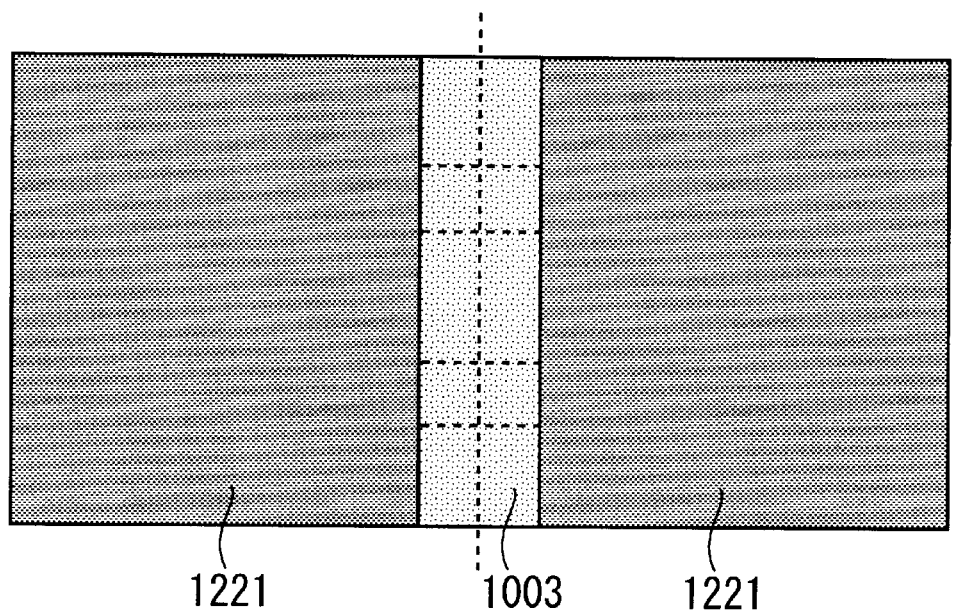
FIGS. 16A and 16B are plan views schematically showing a process for manufacturing the semiconductor device according to the third embodiment of the present invention.
Figure 18A:
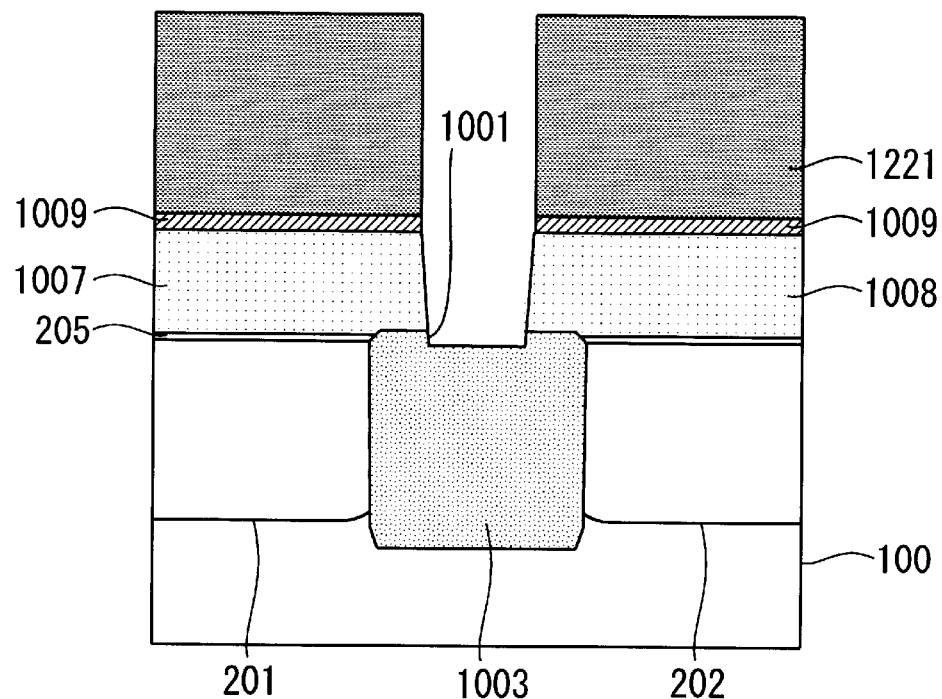
FIGS. 18A and 18B are cross-sectional views schematically depicting a process for manufacturing the semiconductor device according to the third embodiment of the present invention.

Next, for example, tungsten silicide ($WSi_x$) film is deposited on the polycrystalline silicon film 1007, 1008 with a thickness of about 10 nm as a first barrier metal film 1009 by a sputtering method as shown in FIG. 18A. Thereafter, a resist mask 1221 having an opening whose width is about 0.15 μm, is formed on the first barrier metal film 1009 at the border part between the N channel region 101 and the P channel region 102. Further, the first barrier metal film 1009 exposed at the opening is removed by dry etching. After the first barrier metal film 1009 has perfectly been removed, the polycrystalline silicon film 1007, 1008 are further removed by dry etching and the lower element isolation oxide film 1003 is removed to thereby define a trench 1001. FIG. 16A is a plan view showing a state in which the resist mask 1221 for opening the boundary between the N channel region 101 and the P channel region 102 has been formed.

Figure 18B:
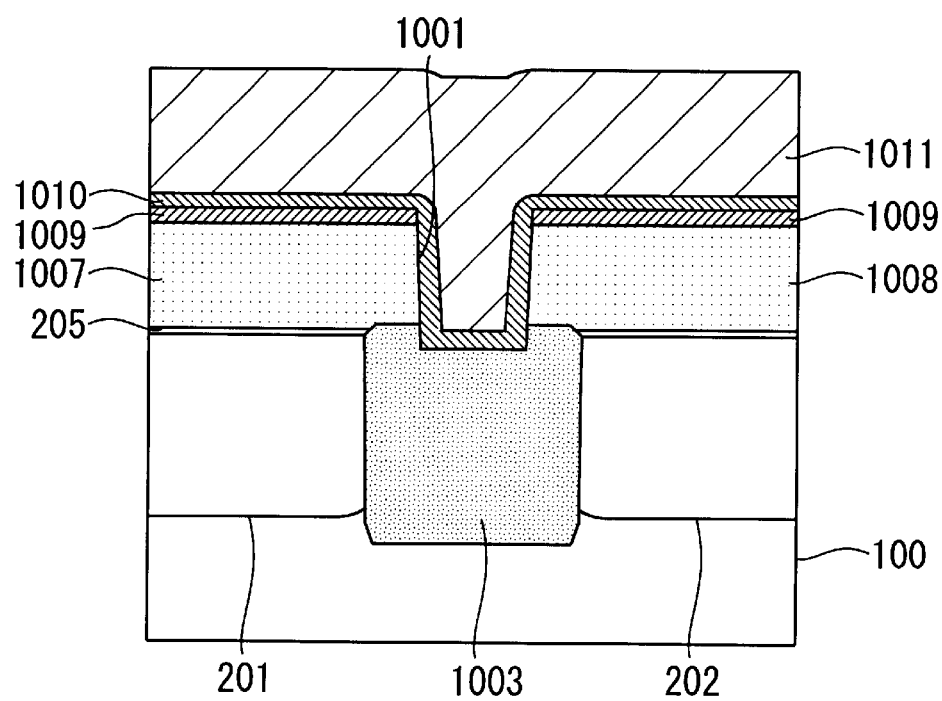
Figure 19:
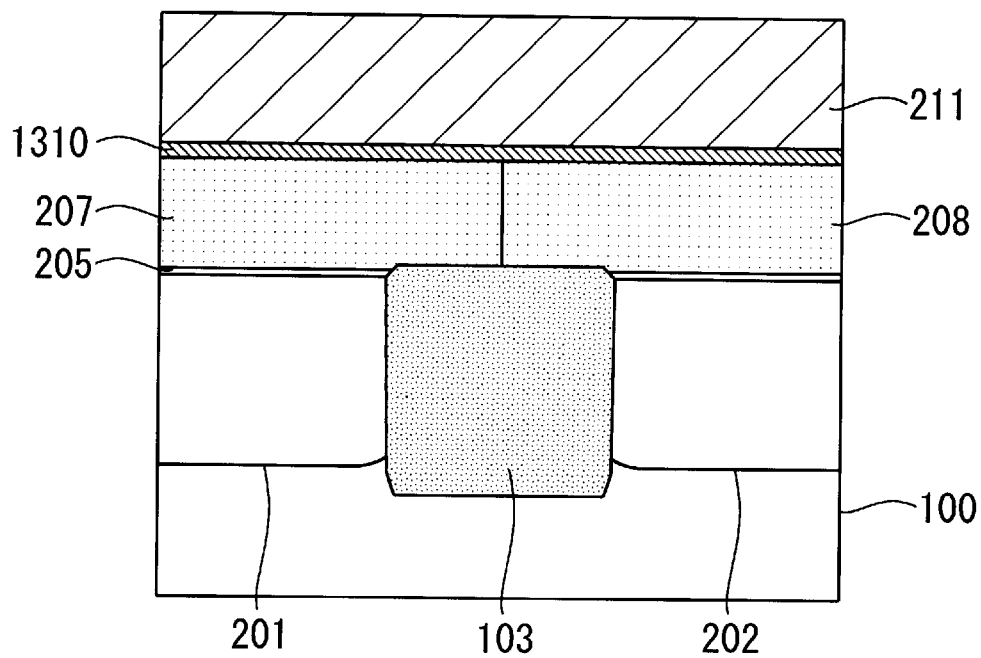
FIG. 19 is a schematic cross-sectional view showing a conventional semiconductor device.
Figure 20:
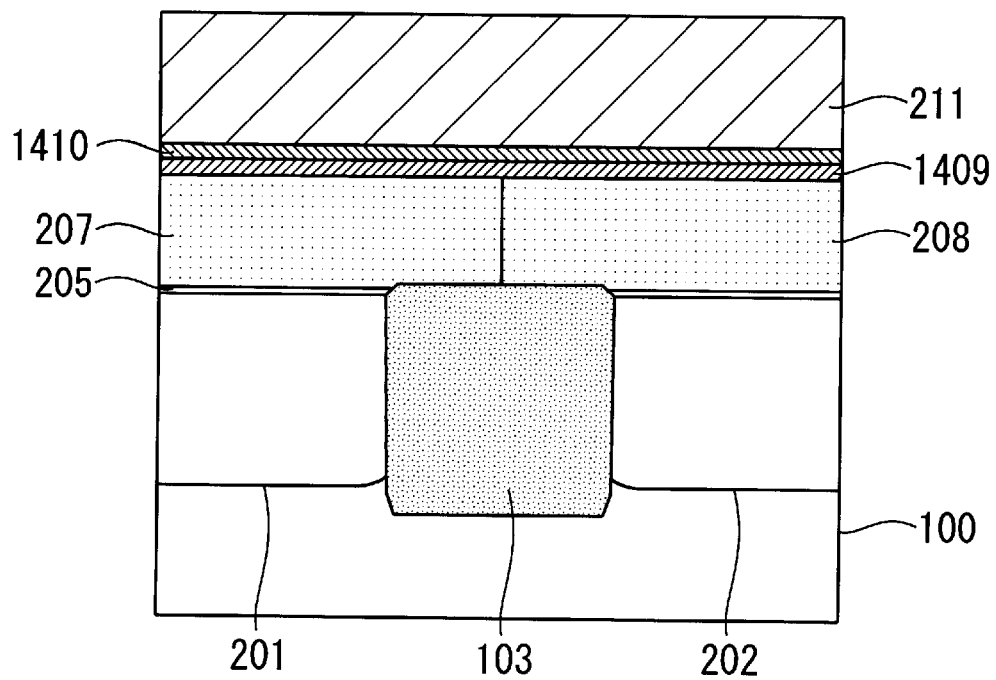
FIG. 20 is a schematic cross-sectional view illustrating a conventional semiconductor device.

Next, the resist mask 1221 is removed by the method such as ashing. As shown in FIG. 18B, for example, a tungsten nitride film is deposited over the first barrier metal 1009 and the polycrystalline silicon film 1007, 1008 provided in the trench 1001 with a thickness of about 10 nm as a second barrier metal film 1010 by a sputtering method. Afterwards, for example, a tungsten (W) film is deposited on the second barrier metal film 1010 by 100 nm in thickness as a metal film 1011 by the sputtering method.

Figure 16B:
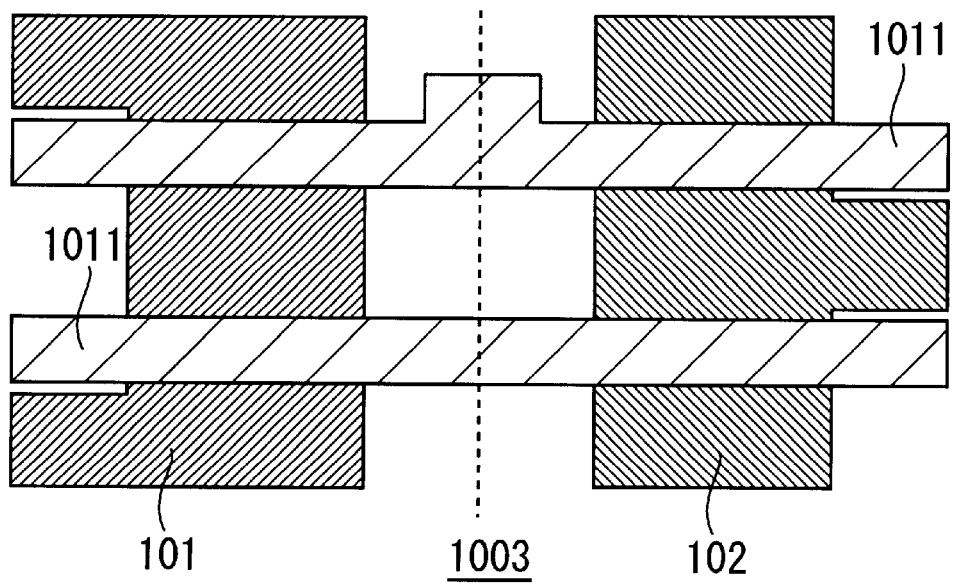

Next, a gate mask (not shown) for forming each gate electrode is formed on the metal film 1011 by photolithography and dry etching following it, and the metal film 1011, the second barrier metal film 1010, the first barrier metal film 1009 and the polycrystalline silicon film 1007, 1008 are dry-etched. Thus, a gate electrode 105 used as a polymetal gate electrode, which comprises the metal film 1011, the second barrier metal film 1010, the first barrier metal film 1009 and the polycrystalline silicon film 1007, is formed on its corresponding N channel region 101, whereas a gate electrode 106 used as a polymetal gate electrode, which comprises the metal film 1011, the second barrier metal film 1010, the first barrier metal film 1009 and the polycrystalline silicon film 1008, is formed on its corresponding P channel region 102. FIG. 16B shows a state in which the gate electrodes 105 and 106 have been formed. In this condition, the upper surface of the metal film 1011 formed as the top layer of each of the gate electrodes 105 and 106 is exposed.

Thereafter, a P well 201 and an N well 202 placed on both sides of respective patterns for the gate electrodes 105 and 106 are subjected to ion implantation to thereby form an impurity diffused layer which functions as each of a source and a drain, followed by formation of an interlayer insulating film and a predetermined wiring layer, whereby the semiconductor device having the dual gate electrodes, according to the third embodiment is completed.

Incidentally, the present embodiment has also described the case where each of the polymetal gate electrodes (comprising the metal film 1011, the second barrier metal film 1010, the first barrier metal film 1009 and the polycrystalline silicon film 1008, 1007) is etched by the resist mask. However, even when the polymetal gate electrode is etched by using a hard mask, e.g., an oxide film, a nitride film or a laminated film of an oxide film and a nitride film as a mask, it can be said that similar handling is allowed.

Further, the present embodiment has described the case in which the first barrier metal film 1009 is dry-etched. However, even when the first barrier metal film 1009 is wet-etched using, for example, aqueous hydrofluoric acid, and thereafter the polycrystalline silicon film 1007, 1008 and the element isolation oxide film 1001 are dry-etched in parts, it can be said that similar handling is allowed. While the present embodiment has also described the case in which the polycrystalline polysilicon film 1206 (1207, 1208) has been grown for the polymetal gate electrode, amorphous silicon may be grown or monocrystal silicon may be grown by an epitaxial method.

Incidentally, the aforementioned first through third embodiments have respectively described the case in which the tungsten silicide ($WSi_x$) has been used as the first barrier metal films 209, 609 and 1009. However, even if titanium silicide ($TiSi_x$), tantalum silicide ($TaSi_x$) and cobalt silicide ($CoSi_x$) are used, a similar effect can be obtained. If, for example, WSiX ranges from x=1.0 to 2.5 in composition even in the case of no x=2 even where the metal and silicon in each of the first barrier metal films 209, 609 and 1009 differ in composition ratio, then handling similar to above can be done. A description has also been made of the case in which the thicknesses of the first barrier metal films 209, 609 and 1009 are respectively 10 nm. However, even when the thickness of each barrier metal film ranges from 0.1 nm to 100 nm, an effect similar to above can be obtained. While the above embodiments have respectively described the case in which the first barrier metal films 209, 609 and 1009 are formed by the sputtering method, they may be grown by a CVD method. Further, when the first barrier metal films 209, 609 and 1009 are formed, a metal such as tungsten is grown and may be silicidized by a RTA (Rapid Thermal Annealing) method.

While the above-described first through third embodiments have respectively described the case in which the tungsten nitride (WN) has been used as the second barrier metal films 210, 610 and 1010, a similar effect can be obtained even if $WSiN_x$, TiN, $TiSi_x$, TaN and $TaSi_x$ are used. While the above embodiments have also described the case in which the thicknesses of the second barrier metal films 210, 610 and 1010 are set as 10 nm, a similar effect can be obtained even in the case where the thicknesses thereof range from 0.1 nm to 100 nm. While the above embodiments have further described the case in which the second barrier metal films 210, 610 and 1010 are formed by the sputtering method, they may be formed by the CVD method. Alternatively, even if tungsten (W) is grown and nitrided, a similar effect can be obtained.

While the aforementioned first through third embodiments have respectively described the case in which the tungsten (W) is used as the metal films 211, 611 and 1011, aluminum (Al), copper (Cu), cobalt (Co), tantalum (Ta), titanium (Ti), ruthenium (Ru) or platinum (Pt) may be used. Alternatively, even if silicide composed of these metals is used, a similar effect can be obtained. While a description has been made of the case where the thickness of each of the metal films 211, 611 and 1011 is 100 nm, a similar effect can be obtained even if the thickness thereof ranges from 5 nm to 500 nm. While a description has also been made of the case where the metal films 211, 611 and 1011 are grown by the sputtering method, they may be deposited by the CVD method. Alternatively, even if a metal is brought into silicidation after the deposition of the metal, a similar effect can be obtained.

While the above-described first through third embodiments have respectively described the case in which the gate electrodes 107, 507 and 907 at the border part between the N channel region 101 and the P channel region 102 are respectively 0.15 μm in width, they may be set so as to have widths ranging from 0.05 μm to 10 μm smaller than the minimum size by using a RELACS (Resolution Enhancement Lithography Assisted by Chemical Shrink) method, for example. While a description has also been made of the case in which the gate electrodes 107, 507 and 907 are formed as trench patterns each having a width of 0.15 μm, a similar effect can be obtained even if the gate electrodes 107, 507 and 907 are formed as opened hole patterns.

The entire disclosure of a Japanese Patent Application No. 2001-9881, filed on Jan. 18, 2001 including specification, claims, drawings and summary, on which the Convention priority of the present application is based, are incorporated herein by reference in its entirety.

What is claimed is:

1. A semiconductor device comprising:
   element active regions for an N channel region and a P channel region, said element active regions being formed so as to adjoin each other; and
   a polycrystalline silicon film, having an upper surface, formed so as to stride over both channel regions and an element isolation oxide film for separating both channel regions from each other,
   wherein a gate electrode comprises a structure in which said polycrystalline silicon film, a first barrier metal film, a second barrier metal film and a metal film are laminated in order from below, said first barrier metal film is removed at a border part between said N channel region and said P channel region, and said second barrier metal film is in close contact with a portion of the upper surface of the polycrystalline silicon film at the border part.

2. The semiconductor device according to claim 1, wherein said polycrystalline silicon film is removed by a predetermined amount from upper surfaces thereof together with said first barrier metal film at the border part between said N channel region and said P channel region.

3. A semiconductor device comprising:
   element active regions for an N channel region and a P channel region, said element active regions being formed so as to adjoin each other; and
   a gate electrode formed so as to stride over both channel regions and an element isolation oxide film for separating both channel regions from each other,
   wherein:
      said gate electrode comprises a structure in which a polycrystalline silicon film, a first barrier metal film, a second barrier metal film and a metal film are laminated in order from below;
      said first barrier metal film is removed at a border part between said N channel region and said P channel region;
      said polycrystalline silicon film is removed together with said first barrier metal film at the border part between said N channel region and said P channel region;
      said second barrier metal film and said element isolation oxide film are in close contact with each other at the border part; and
      said element isolation oxide film is removed by a predetermined amount from an upper surface thereof at a portion where said second barrier metal film and said element isolation oxide film are brought into close contact with each other.

* * * * *